United States Patent
Lekas et al.

(10) Patent No.: US 12,322,695 B2
(45) Date of Patent: Jun. 3, 2025

(54) MAGNETIC CORE WITH HARD FERROMAGNETIC BIASING LAYERS AND STRUCTURES CONTAINING SAME

(71) Applicant: Ferric Inc., New York, NY (US)

(72) Inventors: Michael Lekas, Brooklyn, NY (US); Ryan Davies, New York, NY (US); Noah Sturcken, New York, NY (US); Denis Shishkov, Brooklyn, NY (US)

(73) Assignee: Ferric Inc., New York, NY (US)

( * ) Notice: Subject to any disclaimer, the term of this patent is extended or adjusted under 35 U.S.C. 154(b) by 1083 days.

(21) Appl. No.: 17/108,096

(22) Filed: Dec. 1, 2020

(65) Prior Publication Data

US 2022/0173035 A1 Jun. 2, 2022

(51) Int. Cl.
  *H01L 23/522* (2006.01)
  *H01F 1/03* (2006.01)
  (Continued)

(52) U.S. Cl.
  CPC ....... *H01L 23/5227* (2013.01); *H01F 1/0306* (2013.01); *H01F 27/24* (2013.01); *H01F 41/0206* (2013.01); *H10D 1/20* (2025.01)

(58) Field of Classification Search
  CPC ... H01L 23/5227; H01L 28/10; H01F 1/0306; H01F 27/24; H01F 41/0206;
  (Continued)

(56) References Cited

U.S. PATENT DOCUMENTS

| 1,553,983 A | 9/1925 | Casper |
| 2,931,966 A | 4/1960 | Rockey |

(Continued)

FOREIGN PATENT DOCUMENTS

| CN | 101840993 A | 9/2010 |
| CN | 106910602 A | 6/2017 |

(Continued)

OTHER PUBLICATIONS

Office Action from Taiwan Intellectual Property Office for Taiwanese Application No. 110144587. Dated Oct. 6, 2022.
(Continued)

*Primary Examiner* — Ermias T Woldegeorgis
(74) *Attorney, Agent, or Firm* — Intrinsic Law Corp.

(57) ABSTRACT

A planar magnetic core includes multiple ferromagnetic layers including multiple hard ferromagnetic bias layers and multiple soft ferromagnetic layers. Each ferromagnetic layer comprises a soft ferromagnetic layer or a hard ferromagnetic bias layer. Each hard ferromagnetic bias layer is a neighboring ferromagnetic layer of at least one soft ferromagnetic layer. The planar magnetic core also includes a plurality of insulating layers, each insulating layer disposed between adjacent ferromagnetic layers. Each ferromagnetic layer has an easy axis of magnetization parallel to a principal plane of the planar magnetic core, where the easy axes of magnetization are aligned. Each hard ferromagnetic bias layer is magnetized to create an in-plane bias magnetic flux through the hard ferromagnetic bias layer in a first direction that is parallel to the easy axis of magnetization and forms a closed path through a neighboring soft ferromagnetic layer in a second direction parallel to the first direction.

27 Claims, 9 Drawing Sheets

(51) Int. Cl.
*H01F 27/24* (2006.01)
*H01F 41/02* (2006.01)
*H10D 1/20* (2025.01)

(58) Field of Classification Search
CPC ............ H01F 17/0013; H01F 17/0033; H01F 2003/103; H01F 2017/0066; H01F 2017/0086; H01F 3/10; H10D 30/674
See application file for complete search history.

(56) References Cited

U.S. PATENT DOCUMENTS

| | | |
|---|---|---|
| 3,110,613 A | 11/1963 | Bean |
| 3,543,249 A | 11/1970 | Bobeck et al. |
| 3,573,760 A | 4/1971 | Chang et al. |
| 3,614,554 A | 10/1971 | Shield et al. |
| 4,025,379 A | 5/1977 | Whetstone |
| 4,103,315 A | 7/1978 | Hempstead et al. |
| 4,236,946 A | 12/1980 | Aboaf et al. |
| 5,070,317 A | 12/1991 | Bhagat |
| 5,079,534 A | 1/1992 | Steingroever et al. |
| 5,225,971 A | 7/1993 | Spreen |
| 5,319,343 A | 6/1994 | Jeffries |
| 5,399,372 A | 3/1995 | Grimes et al. |
| 5,583,474 A | 12/1996 | Mizoguchi et al. |
| 5,635,892 A | 6/1997 | Ashby |
| 5,831,431 A | 11/1998 | Gottfried-Gottfried et al. |
| 5,912,553 A | 6/1999 | Mengelkoch |
| 6,118,351 A | 9/2000 | Kossives et al. |
| 6,362,986 B1 | 3/2002 | Schultz et al. |
| 6,542,060 B2 | 4/2003 | Fedeli |
| 6,542,379 B1 | 4/2003 | Lauffer et al. |
| 6,856,226 B2 | 2/2005 | Gardner |
| 6,940,384 B2 | 9/2005 | Hooey et al. |
| 7,230,408 B1 | 6/2007 | Vinn et al. |
| 7,554,399 B1 | 6/2009 | Gaboriau et al. |
| 7,636,242 B2 | 12/2009 | Hazucha et al. |
| 7,719,084 B2 | 5/2010 | Gardner et al. |
| 7,791,837 B2 | 9/2010 | Fujiwara |
| 7,867,787 B2 | 1/2011 | Gardner et al. |
| 7,868,431 B2 | 1/2011 | Feng et al. |
| 7,875,955 B1 | 1/2011 | Hopper et al. |
| 8,108,984 B2 | 2/2012 | Gardner et al. |
| 8,270,137 B2 | 9/2012 | Briere et al. |
| 8,288,277 B2 | 10/2012 | Takahashi et al. |
| 8,432,144 B2 | 4/2013 | Notani |
| 8,558,344 B2 | 10/2013 | Chen |
| 9,047,890 B1 | 6/2015 | Herget |
| 9,647,053 B2* | 5/2017 | Sturcken ............ H01L 21/32051 |
| 9,679,958 B2 | 6/2017 | Sturcken et al. |
| 9,728,596 B1 | 8/2017 | Chen et al. |
| 10,284,314 B2 | 5/2019 | Lunttila et al. |
| 2002/0060621 A1 | 5/2002 | Duffy et al. |
| 2002/0136929 A1 | 9/2002 | Oikawa et al. |
| 2003/0005569 A1 | 1/2003 | Hiatt et al. |
| 2003/0070282 A1 | 4/2003 | Hiatt et al. |
| 2003/0090244 A1 | 5/2003 | Shenai et al. |
| 2003/0160677 A1 | 8/2003 | Fujiwara et al. |
| 2004/0009614 A1 | 1/2004 | Ahn et al. |
| 2004/0135061 A1 | 7/2004 | Haugs et al. |
| 2004/0166308 A1 | 8/2004 | Raksha et al. |
| 2004/0196019 A1 | 10/2004 | Schneider |
| 2005/0088269 A1 | 4/2005 | Hatano |
| 2005/0156704 A1 | 7/2005 | Gardner et al. |
| 2006/0197510 A1 | 9/2006 | Chandrasekaran |
| 2006/0263727 A1 | 11/2006 | Lee et al. |
| 2006/0273418 A1 | 12/2006 | Chung et al. |
| 2007/0037414 A1 | 2/2007 | Yamauchi et al. |
| 2007/0218273 A1* | 9/2007 | Ikeda ............ B82Y 25/00 |
| | | 428/323 |
| 2007/0290362 A1 | 12/2007 | Hsu et al. |
| 2008/0003699 A1 | 1/2008 | Gardner et al. |
| 2008/0023791 A1 | 1/2008 | Muthukumar et al. |
| 2008/0172861 A1 | 7/2008 | Holmes |
| 2008/0316647 A1 | 12/2008 | Joisten et al. |
| 2009/0007418 A1 | 1/2009 | Edo et al. |
| 2009/0068762 A1 | 3/2009 | Takahashi et al. |
| 2009/0128274 A1 | 5/2009 | Park et al. |
| 2009/0175014 A1 | 7/2009 | Zeng et al. |
| 2009/0188104 A1 | 7/2009 | Ching et al. |
| 2009/0324982 A1 | 12/2009 | Aramaki et al. |
| 2011/0151588 A1 | 6/2011 | Ashdown et al. |
| 2011/0208019 A1 | 8/2011 | Sato et al. |
| 2011/0279214 A1 | 11/2011 | Lee et al. |
| 2012/0086416 A1 | 4/2012 | Kudo et al. |
| 2012/0154966 A1 | 6/2012 | Wolfus et al. |
| 2013/0027170 A1 | 1/2013 | Chen |
| 2013/0056847 A1 | 3/2013 | Chen et al. |
| 2013/0099334 A1 | 4/2013 | Mohan et al. |
| 2013/0099762 A1 | 4/2013 | Terrovitis |
| 2013/0134534 A1* | 5/2013 | Sbiaa ............ H10N 50/80 |
| | | 257/421 |
| 2013/0206845 A1 | 8/2013 | Koujima et al. |
| 2013/0228716 A1 | 9/2013 | Suetsuna et al. |
| 2013/0234821 A1 | 9/2013 | Shim |
| 2014/0026654 A1 | 1/2014 | Klopping |
| 2014/0027879 A1 | 1/2014 | Weyers et al. |
| 2014/0062646 A1 | 3/2014 | Morrissey et al. |
| 2014/0068932 A1 | 3/2014 | Sturcken |
| 2014/0071636 A1 | 3/2014 | Sturcken |
| 2014/0203398 A1 | 7/2014 | Sturcken |
| 2014/0209691 A1 | 7/2014 | Finn et al. |
| 2014/0240074 A1 | 8/2014 | Qui et al. |
| 2014/0252548 A1 | 9/2014 | Yen |
| 2014/0266541 A1 | 9/2014 | Sakamoto et al. |
| 2015/0036308 A1 | 2/2015 | Sturcken |
| 2015/0137776 A1 | 5/2015 | Thomas et al. |
| 2015/0171157 A1 | 6/2015 | Sturcken et al. |
| 2015/0187488 A1 | 7/2015 | Williams et al. |
| 2015/0243881 A1 | 8/2015 | Sankman et al. |
| 2015/0302974 A1 | 10/2015 | Zhao |
| 2015/0303583 A1 | 10/2015 | Takahashi et al. |
| 2015/0349424 A1 | 12/2015 | Hur et al. |
| 2016/0086717 A1 | 3/2016 | Harada et al. |
| 2016/0126008 A1 | 5/2016 | Sturcken |
| 2016/0189852 A1 | 6/2016 | Jeon et al. |
| 2016/0196908 A1 | 7/2016 | Ohta et al. |
| 2016/0233153 A1 | 8/2016 | Kidwell et al. |
| 2017/0076860 A1 | 3/2017 | Deligianni et al. |
| 2017/0250133 A1 | 8/2017 | Sturcken et al. |
| 2017/0256353 A1 | 9/2017 | Park et al. |
| 2018/0061545 A1 | 3/2018 | Murashima et al. |
| 2018/0096771 A1 | 4/2018 | Deligianni et al. |
| 2018/0286581 A1 | 10/2018 | Deligianni et al. |
| 2018/0308612 A1 | 10/2018 | Park et al. |
| 2018/0295724 A1 | 11/2018 | Sturcken et al. |
| 2019/0164681 A1 | 5/2019 | Kidwell et al. |
| 2020/0082963 A1 | 3/2020 | Suetsuna et al. |
| 2020/0152364 A1 | 5/2020 | Sturcken et al. |
| 2022/0085669 A1 | 3/2022 | Kinouchi et al. |

FOREIGN PATENT DOCUMENTS

| | | |
|---|---|---|
| CN | 106852099 B | 1/2020 |
| DE | 102017101966 A1 | 8/2018 |
| FR | 2817622 A1 | 6/2002 |
| FR | 2905792 A1 | 3/2008 |
| JP | S5821810 A | 2/1983 |
| JP | 01028957 A | 1/1989 |
| JP | 05082736 A | 4/1993 |
| JP | H05291063 A | 11/1993 |
| JP | 60124859 A | 7/1995 |
| JP | 109162354 A | 6/1997 |
| JP | H10284314 A | 10/1998 |
| JP | 2000068133 A | 3/2000 |
| JP | 2002190411 A | 7/2002 |
| JP | 2006228824 A | 8/2006 |
| TW | 200417759 A | 7/2004 |
| WO | 2008143635 A1 | 11/2008 |
| WO | 2012166877 A1 | 12/2012 |

(56) References Cited

FOREIGN PATENT DOCUMENTS

| WO | 2021049995 A1 | 3/2021 |
| WO | 2021140156 A1 | 7/2021 |

OTHER PUBLICATIONS

N. Sturcken et al., "Design of Coupled Power Inductors with Crossed Anisotropy Magnetic Core for Integrated Power Conversion" IEEE-APEC 2012, pp. 417-423, doi: 10.1109/APEC.2012.6165853.

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled Magnetic-Core Inductors on Silicon Interposer Delivering 10.8A/mm", IEEE International Solid-State Circuits Conference, Feb. 22, 2012, p. 3-5, Session 23, IEEE.

N. A. Sturcken, "Integrated Voltage Regulators with Thin-Film Magnetic Power Inductors", 2013, pp. 1-166, Columbia University.

ISA, "International Search Report", PCT/US2018/036832, Aug. 28, 2018.

Office Action from Taiwan Intellectual Property Office for Taiwanese Application No. 111125612, dated Feb. 17, 2023.

International Search Report for PCT Application No. PCT/US2022/071251, dated Jan. 5, 2023.

ISA, "Invitation to Pay Additional Fees and, Where Applicable, Protest Fee", PCT/US2022/071251, Nov. 30, 2022.

Vacuumschmelze Gmbh & Co. KG, Soft Magnetic Materials and Semi-finished Products, Edition 2002, Hanau, Germany.

\* cited by examiner

MAGNETIC CORE WITH HARD FERROMAGNETIC BIASING LAYERS AND STRUCTURES CONTAINING SAME

TECHNICAL FIELD

This application relates generally to magnetic cores and devices that include magnetic cores such as inductors.

BACKGROUND

Inductors for microelectronics include an alternating arrangement of soft ferromagnetic layers and insulating layers. An example of a typical horizontally-laminated magnetic core 10 is illustrated in FIG. 1A. The core includes soft ferromagnetic layers 100 with an insulator layer 110 disposed between neighboring soft ferromagnetic layers 100. The coil is configured to generate a magnetic flux through the soft ferromagnetic layers 100, which results in alternating magnetization states 120, as indicated by the arrows.

One problem with this configuration is that some of the magnetic flux forms a closed path within a given layer in addition to forming a closed path in a neighboring layer. Forming a closed path within a given layer results in multiple magnetic domains 130 with antiparallel magnetization states 135 that minimize the energy for the intra-layer closed path(s), for example as illustrated in FIG. 1B which illustrates a top view of the top soft ferromagnetic layer 100 in core 10. The top insulator 110 is not illustrated in FIG. 1B for clarity. Magnetic domain walls 140 form between the magnetic domains 130 in which some of the magnetic moments 145 are not aligned with either magnetic domain 130. The applied field from the inductor coil causes these magnetic moments 145 to reorient, which creates both hysteresis and eddy current power loss.

It would be desirable to overcome these and/or other deficiencies in the art.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a horizontally-laminated planar magnetic core comprising: a plurality of ferromagnetic layers that includes a plurality of hard ferromagnetic layers and a plurality of soft ferromagnetic layers, wherein: each ferromagnetic layer comprises one of the soft ferromagnetic layers or one of the hard ferromagnetic layers, and each hard ferromagnetic layer is a neighboring ferromagnetic layer of at least one soft ferromagnetic layer. The horizontally-laminated planar magnetic core further comprises a plurality of insulating layers, each insulating layer disposed between adjacent ferromagnetic layers, wherein each ferromagnetic layer has an easy axis of magnetization parallel to a principal plane of the planar magnetic core, and the easy axes of magnetization are aligned.

In one or more embodiments, the ferromagnetic layers are stacked along a height of the planar magnetic core. In one or more embodiments, the plurality of hard ferromagnetic layers includes a top hard ferromagnetic layer disposed as a top ferromagnetic layer. In one or more embodiments, the plurality of hard ferromagnetic layers includes a bottom hard ferromagnetic layer disposed as a bottom ferromagnetic layer. In one or more embodiments, the plurality of soft ferromagnetic layers are disposed between the top and bottom hard ferromagnetic layers. In one or more embodiments, the plurality of soft ferromagnetic layers comprises N soft ferromagnetic layers, where N is an odd integer greater than or equal to 3.

In one or more embodiments, a soft ferromagnetic thickness of each soft ferromagnetic layer is the same, a hard ferromagnetic thickness of each hard ferromagnetic layer is the same, and the hard ferromagnetic thickness is related to the soft ferromagnetic thickness. In one or more embodiments, a ratio of the hard ferromagnetic thickness to the soft ferromagnetic thickness is $$\frac{1}{2} \times \frac{M_{S\_soft}}{M_{S\_hard}} : 1$$

where $M_{S\_soft}$ is the saturation magnetization of each soft ferromagnetic layer and $M_{S\_hard}$ is the saturation magnetization of each hard ferromagnetic layer.

In one or more embodiments, the top and bottom hard ferromagnetic layers are each magnetized to produce a respective bias magnetic flux through the top and bottom hard ferromagnetic layers, respectively, in a first direction that is parallel to the easy axes of magnetization in the top and bottom hard ferromagnetic layers. In one or more embodiments, the respective bias magnetic flux through the top hard ferromagnetic layer forms a closed loop through a first neighboring soft ferromagnetic layer, the respective bias magnetic flux through the bottom hard ferromagnetic layer forms a closed loop through a second neighboring soft ferromagnetic layer, and the respective bias magnetic flux passes through the first and second neighboring soft ferromagnetic layers in a second direction that is opposite to the first direction. In one or more embodiments, the respective bias magnetic flux through the first and second neighboring soft ferromagnetic layers induces a magnetic flux through the first and second neighboring soft ferromagnetic layers in the second direction, the induced magnetic flux through the first neighboring soft ferromagnetic layer forms a closed loop through a third neighboring soft ferromagnetic layer in the first direction, the induced magnetic flux through the second neighboring soft ferromagnetic layer forms a closed loop through a fourth neighboring soft ferromagnetic layer in the first direction, the top hard ferromagnetic layer and the third neighboring soft ferromagnetic layer are the neighboring ferromagnetic layers of the first neighboring soft ferromagnetic layer, and the bottom hard ferromagnetic layer and the fourth neighboring soft ferromagnetic layer are the neighboring ferromagnetic layers of the second neighboring soft ferromagnetic layer.

In one or more embodiments, the hard and soft ferromagnetic layers comprise cobalt, iron, and/or nickel. In one or more embodiments, the insulating layers comprise: (a) aluminum, cobalt, chromium, silicon, tantalum, titanium, and/or zirconium, or (b) a compound of (1) aluminum, cobalt, chromium, silicon, tantalum, titanium, and/or zirconium and (2) oxygen and/or nitrogen. In one or more embodiments, each hard ferromagnetic layer has a coercivity above 50 Oe, and each soft ferromagnetic layer has a coercivity below 1 Oe. In one or more embodiments, a thickness of each ferromagnetic layer is in a range of about 10 nm to about 1,000 nm, the thickness measured with respect to an axis that is orthogonal to the principal plane of the planar magnetic core. In one or more embodiments, a thickness of each insulating layer is in a range of about 1 nm to about 50 nm, the thickness of each insulating layer measured with respect to the axis. In one or more embodiments, a total thickness of the core is less than or equal to 100,000 nm, the total thickness measured with respect to the axis.

Another aspect of the invention is directed to a horizontally-laminated planar magnetic core comprising: a plurality of soft-hard ferromagnetic layer pairs, each soft-hard ferromagnetic layer pair including a soft ferromagnetic layer and a hard ferromagnetic layer; an intra-pair spacer layer disposed between the soft ferromagnetic layer and the hard ferromagnetic layer in each soft-hard ferromagnetic layer pair; an inter-pair spacer layer disposed between neighboring soft-hard ferromagnetic layer pairs, wherein an inter-pair spacer thickness of each inter-pair spacer layer is greater than an intra-pair spacer thickness of each intra-pair spacer layer, and the inter-pair spacer thickness and the intra-pair spacer thickness are measured with respect to an axis that is orthogonal to a major plane of the core.

In one or more embodiments, for each soft-hard ferromagnetic pair, a relative position of the soft ferromagnetic layer with respect to the hard ferromagnetic layer is the same. In one or more embodiments, for each soft-hard ferromagnetic pair, the soft ferromagnetic layer is disposed below the hard ferromagnetic layer.

In one or more embodiments, the horizontally-laminated planar magnetic core further comprises a first inter-pair spacer layer disposed between a first soft-hard ferromagnetic layer pair and a second soft-hard ferromagnetic layer pair; and a second inter-pair spacer layer disposed between the second soft-hard ferromagnetic layer pair and a third soft-hard ferromagnetic layer pair, the second soft-hard ferromagnetic layer pair disposed between the first and third soft-hard ferromagnetic layer pairs.

In one or more embodiments, a soft ferromagnetic thickness of each soft ferromagnetic layer is the same, a hard ferromagnetic thickness of each hard ferromagnetic layer is the same, the soft and hard ferromagnetic thicknesses are measured with respect to the axis, and the hard ferromagnetic thickness is related to the soft ferromagnetic thickness. In one or more embodiments, in each soft-hard ferromagnetic layer pair: the hard ferromagnetic layer is magnetized to produce a bias magnetic flux through the hard ferromagnetic layer in a first direction that is parallel to an easy axis of magnetization in the hard ferromagnetic layer, the easy axis of magnetization disposed within a major plane of the hard ferromagnetic layer, and the bias magnetic flux forms a closed loop only through the soft ferromagnetic layer in a second direction that is parallel to an easy axis of magnetization in the soft ferromagnetic layer, the easy axis of magnetization disposed within a major plane of the soft ferromagnetic layer. In one or more embodiments, in each soft-hard ferromagnetic layer pair: the bias magnetic flux through the soft ferromagnetic layer induces a magnetic flux through the soft ferromagnetic layer in the second direction, and the induced magnetic flux forms a closed loop only through the hard ferromagnetic layer in the first direction.

In one or more embodiments, a ratio of the hard ferromagnetic thickness to the soft ferromagnetic thickness is $$\frac{M_{S\_soft}}{M_{S\_hard}} : 1$$

were $M_{S\_soft}$ is the saturation magnetization of each soft ferromagnetic layer and $M_{S\_hard}$ is the saturation magnetization of each hard ferromagnetic layer. In one or more embodiments, the inter-pair spacer thickness of the first and second inter-pair spacer layers is the same, the intra-pair spacer thickness of each intra-pair spacer layer is the same, and the inter-pair spacer thickness is in a range of 2 to 10 times the intra-layer spacer thickness. In one or more embodiments, the intra-pair spacer layers and the inter-pair spacer layers comprise an insulator material.

Yet another aspect of the invention is directed to an inductor comprising: a horizontally-laminated planar magnetic core comprising: a plurality of ferromagnetic layers that includes a plurality of hard ferromagnetic layers and a plurality of soft ferromagnetic layers, wherein each ferromagnetic layer comprises one of the soft ferromagnetic layers or one of the hard ferromagnetic layers, and each hard ferromagnetic layer is a neighboring ferromagnetic layer of at least one neighboring soft ferromagnetic layer. The inductor further comprises a plurality of insulating layers, each insulating layer disposed between adjacent ferromagnetic layers. Each ferromagnetic layer has an easy axis of magnetization parallel to a principal plane of the planar magnetic core, and the easy axes of magnetization are aligned. The inductor further comprises a conductive winding that turns around in a generally spiral manner on the outside of said planar laminated magnetic core.

In one or more embodiments, each ferromagnetic layer has a hard axis of magnetization that is orthogonal to the easy axis of magnetization within a major plane of the respective ferromagnetic layer, and the hard axes of magnetization are aligned, and the conductive winding is configured to produce an inductor coil magnetic flux through the horizontally-laminated planar magnetic core in a direction parallel to the hard axis of magnetization in each ferromagnetic layer. In one or more embodiments, the plurality of hard ferromagnetic layers includes a top hard ferromagnetic layer disposed as a top ferromagnetic layer and a bottom hard ferromagnetic layer disposed as a bottom ferromagnetic layer, the plurality of soft ferromagnetic layers are disposed between the top and bottom hard ferromagnetic layers, each of the top and bottom hard ferromagnetic layers is magnetized to produce a respective bias magnetic flux through the top and bottom hard ferromagnetic layers, respectively, in a first direction that is parallel to the easy axes of magnetization in the top and bottom hard ferromagnetic layers, the bias magnetic flux through the top hard ferromagnetic layer forms a closed loop through a first neighboring soft ferromagnetic layer, the bias magnetic flux through the bottom hard ferromagnetic layer forms a closed loop through a second neighboring soft ferromagnetic layer, and the bias magnetic flux passes through the first and second neighboring soft ferromagnetic layers in a second direction that is opposite to the first direction. In one or more embodiments, the bias magnetic flux through the first and second neighboring soft ferromagnetic layers induces a magnetic flux through the first and second neighboring soft ferromagnetic layers in the second direction, the induced magnetic flux through the first neighboring soft ferromagnetic layer forms a closed loop through a third neighboring soft ferromagnetic layer in the first direction, the induced magnetic flux through the second neighboring soft ferromagnetic layer forms a closed loop through a fourth neighboring soft ferromagnetic layer in the first direction, the top hard ferromagnetic layer and the third neighboring soft ferromagnetic layer are the neighboring ferromagnetic layers of the first neighboring soft ferromagnetic layer, and the bottom hard ferromagnetic layer and the fourth neighboring soft ferromagnetic layer are the neighboring ferromagnetic layers of the second neighboring soft ferromagnetic layer.

Another aspect of the invention is directed to a structure comprising a semiconductor integrated circuit comprising a multilevel wiring network formed on a substrate, wherein the inductor in integrated into the multilevel wiring network.

Yet another aspect of the invention is directed to a method of manufacturing comprising: depositing, over a semiconductor substrate, a plurality of ferromagnetic layers that includes a plurality of hard ferromagnetic layers and a plurality of soft ferromagnetic layers, wherein: each ferromagnetic layer comprises one of the soft ferromagnetic layers or one of the hard ferromagnetic layers, and each hard ferromagnetic layer is a neighboring ferromagnetic layer of at least one neighboring soft ferromagnetic layer. The method further comprises depositing an insulating layer between adjacent ferromagnetic layers; inducing an easy axis of magnetization in each ferromagnetic layer, the easy axes of magnetization aligned and parallel to a top planar surface of the semiconductor substrate; magnetizing each hard ferromagnetic layer so as to produce a bias magnetic flux through the respective hard ferromagnetic layer in a first direction, the bias magnetic flux parallel to the easy axis of magnetization in the respective hard ferromagnetic layer; and defining a horizontally-laminated planar magnetic core that comprises the plurality of ferromagnetic layers and the insulating layers.

In one or more embodiments, the method further comprises defining a hard axis of magnetization in each ferromagnetic layer, the hard axis of magnetization orthogonal to the easy axis of magnetization within a major plane of each ferromagnetic layer; and forming a conductive winding around the horizontally-laminated planar magnetic core, the conductive winding configured to form an inductor coil magnetic field that passes through the horizontally-laminated planar magnetic core in a direction parallel to the hard axis of magnetization in each ferromagnetic layer.

In one or more embodiments, the method further comprises depositing a top hard ferromagnetic layer as a top ferromagnetic layer; depositing a bottom hard ferromagnetic layer as a bottom ferromagnetic layer; and depositing the plurality of soft ferromagnetic layers between the bottom and top hard ferromagnetic layers.

In one or more embodiments, a ratio of a hard ferromagnetic thickness of each hard ferromagnetic layer to a soft ferromagnetic thickness of each soft ferromagnetic layer is $$\frac{1}{2} \times \frac{M_{S\_soft}}{M_{S\_hard}} : 1$$

where $M_{S\_soft}$ is the saturation magnetization of each soft ferromagnetic layer and $M_{S\_hard}$ is the saturation magnetization of each hard ferromagnetic layer, and the soft and hard ferromagnetic thicknesses are measured with respect to an axis that is orthogonal to the top planar surface of the semiconductor substrate.

In one or more embodiments, the method further comprises depositing a plurality of soft-hard ferromagnetic layer pairs, each soft-hard ferromagnetic layer pair including one of the soft ferromagnetic layers and one of the hard ferromagnetic layers; depositing an intra-pair spacer layer between the soft ferromagnetic layer and the hard ferromagnetic layer in each soft-hard ferromagnetic layer pair; and depositing an inter-pair spacer layer between neighboring soft-hard ferromagnetic layer pairs, wherein each insulator layer comprises one of the intra-pair spacer layers or one of the inter-pair spacer layers, an inter-pair spacer layer thickness of each inter-pair spacer layer is greater than an intra-pair spacer layer thickness of each intra-pair spacer layer, and the inter-pair spacer layer thickness and the intra-pair spacer layer thickness are measured with respect to an axis that is orthogonal to the top planar surface of the semiconductor substrate. In one or more embodiments, a ratio of a hard ferromagnetic thickness of each hard ferromagnetic layer to a soft ferromagnetic thickness of each soft ferromagnetic layer is $$\frac{1}{2} \times \frac{M_{S\_soft}}{M_{S\_hard}} : 1$$

where $M_{S\_soft}$ is the saturation magnetization of each soft ferromagnetic layer and $M_{S\_hard}$ is the saturation magnetization of each hard ferromagnetic layer, and the soft and hard ferromagnetic thicknesses are measured with respect to the axis.

BRIEF DESCRIPTION OF THE DRAWINGS

For a fuller understanding of the nature and advantages of the present concepts, reference is made to the detailed description of preferred embodiments and the accompanying drawings.

DETAILED DESCRIPTION

A horizontally-laminated planar magnetic core includes a plurality of ferromagnetic layers, which includes multiple hard ferromagnetic bias layers and multiple soft ferromagnetic layers. At least one soft ferromagnetic layer is the neighboring ferromagnetic layer of each hard ferromagnetic bias layer. Each hard ferromagnetic bias layer is magnetized so it creates an in-plane bias magnetic flux through the respective hard ferromagnetic bias layer in a first direction. The bias magnetic flux forms a closed path by passing through the neighboring soft ferromagnetic layer in a second direction that is opposite to the first direction (e.g., the first and second directions are antiparallel). The ferromagnetic layers are anisotropic such that their easy axes of magnetization are parallel to one another and to the first and second directions. The hard axes of magnetization of the ferromagnetic layers are orthogonal to the easy axes of magnetization within the major plane of the respective ferromagnetic layers.

The bias magnetic flux through the neighboring soft ferromagnetic layer sets the preferential direction for the magnetization of the soft ferromagnetic layer magnetic moments, such that an inter-layer closed path for magnetic flux is formed between the hard ferromagnetic bias layer and the soft ferromagnetic layer(s). This reduces the number of domain walls that are formed in the soft ferromagnetic layer since the magnetic flux now closes in the adjacent hard ferromagnetic bias layer, rather than closing back through the soft ferromagnetic layer which would form new magnetic domains that are magnetized in both the first and second directions. The elimination of magnetic domains, and their associated domain walls, caused by the bias magnetic flux of the hard ferromagnetic bias layer, reduces hysteresis and eddy current power losses in an inductor compared to using an inductor core that does not include hard ferromagnetic bias layers.

An inductor can be formed using the horizontally-laminated planar magnetic core. The coil of the inductor can be configured to produce an inductor coil magnetic flux through the ferromagnetic layers in a direction parallel to the hard axes of magnetization.

Figure 1A:
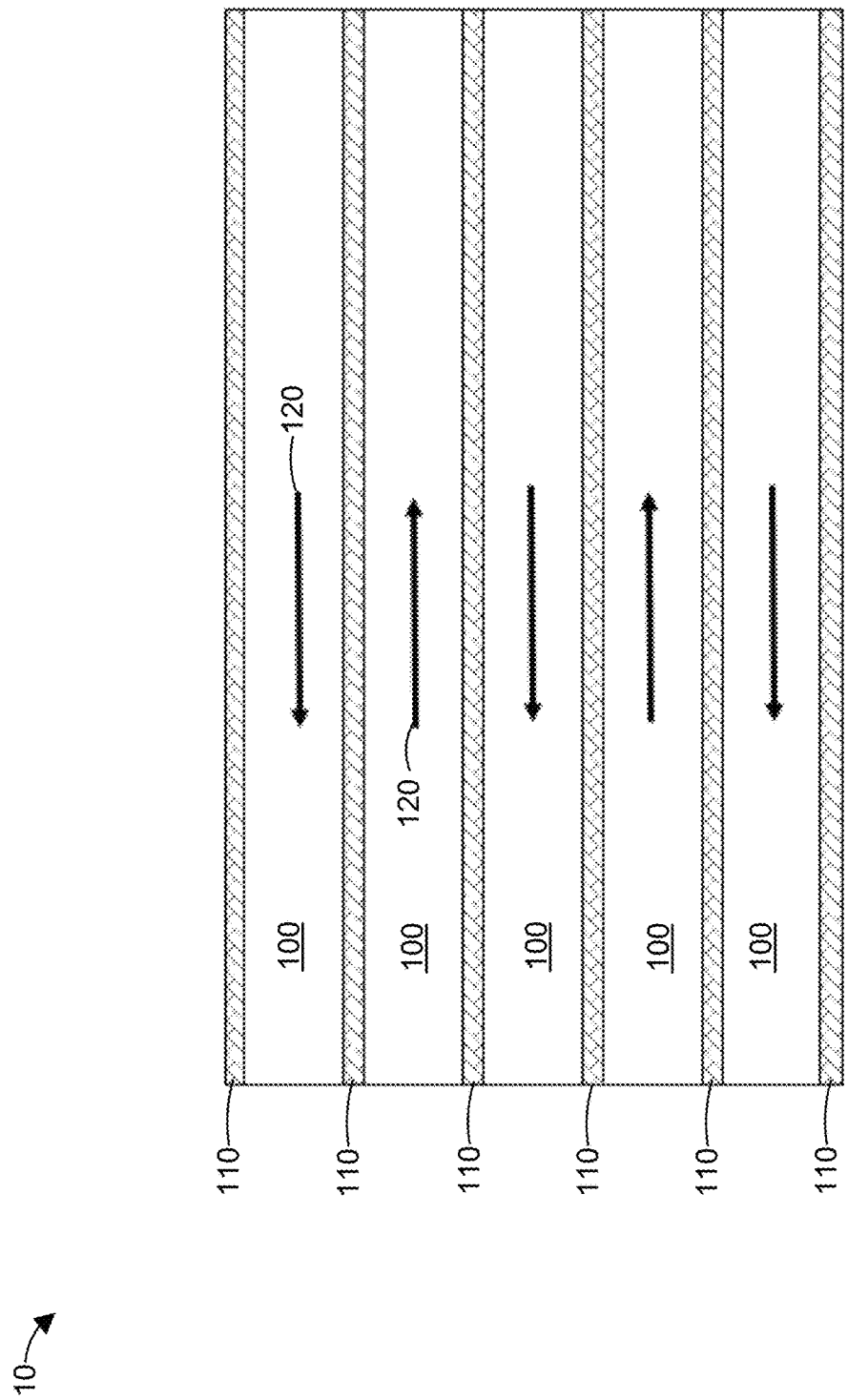
FIG. 1A is a cross-sectional view of an existing horizontally-laminated magnetic core.
Figure 1B:
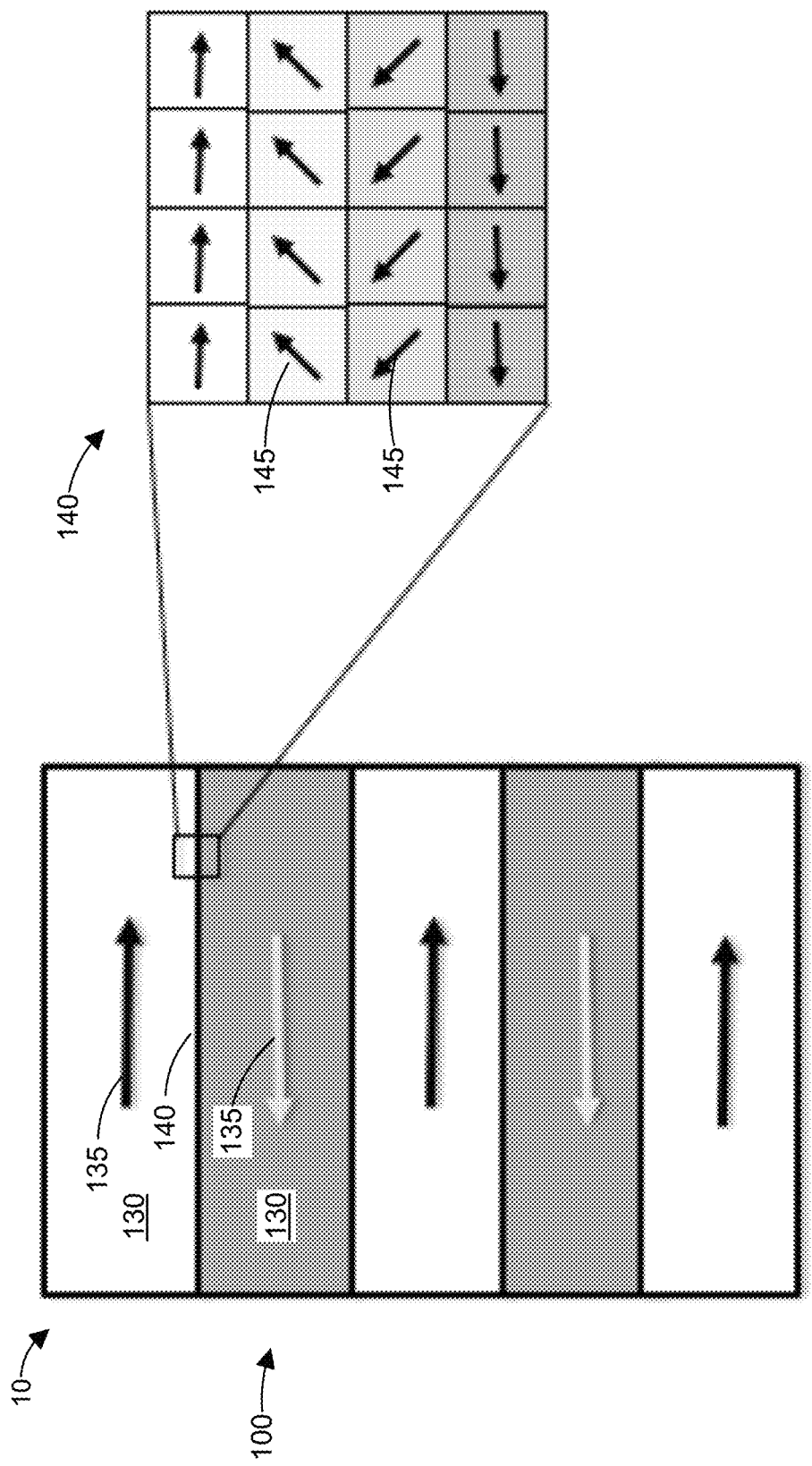
FIG. 1B is a top view of the horizontally-laminated magnetic core illustrated in FIG. 1A.
Figure 2:
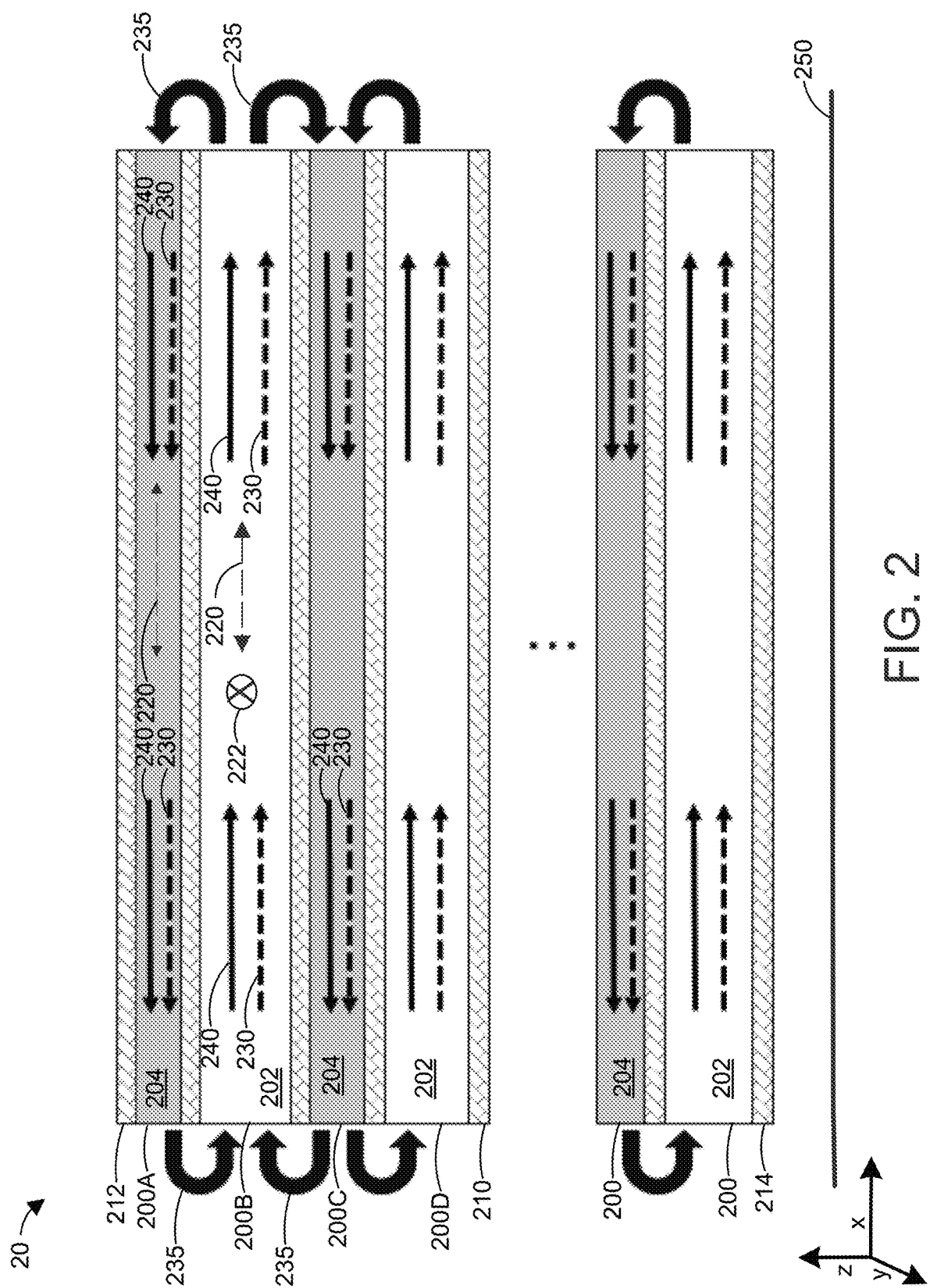
FIG. 2 is a cross-sectional view of a planar magnetic core according to an embodiment.

FIG. 2 is a cross-sectional view of a horizontally-laminated planar magnetic core 20 according to an embodiment. The planar magnetic core 20 can be fabricated on a substrate 250 and/or integrated into a multilevel wiring structure on substrate 250 to form an inductor.

The magnetic core 20 includes a plurality of ferromagnetic layers 200 and insulator layers 210. Each ferromagnetic layer 200 is either a soft ferromagnetic layer 202 or a hard ferromagnetic bias layer 204. The ferromagnetic layers 200 include a plurality of soft ferromagnetic layers 202 and a plurality of hard ferromagnetic bias layers 204, which are arranged in an alternating sequence of (a) a soft ferromagnetic layer 202 and (b) a hard ferromagnetic bias layer 204. The ferromagnetic layers 204 are stacked along the height of the core 20 (e.g., along the "z" axis).

Each hard ferromagnetic bias layer 204 is a neighboring ferromagnetic layer 200 of at least one soft ferromagnetic layer 202. For example, in FIG. 2 the top ferromagnetic layer 200A in the stack of ferromagnetic layers 200 is a top hard ferromagnetic bias layer 204. The neighboring ferromagnetic layer of layer 200A is ferromagnetic layer 200B, which is a soft ferromagnetic layer 202. In another example, the neighboring ferromagnetic layers of the hard ferromagnetic bias layer 200C are soft ferromagnetic layers 200B and 200D.

Each ferromagnetic layer 200 is anisotropic such that its easy axis of magnetization 220 is parallel to the "x" axis and its hard axis of magnetization 222 is parallel to the "y" axis. For example, the hard axis of magnetization 222 is orthogonal to the easy axis of magnetization 220 within the major plane of the ferromagnetic layer 200. The major plane of the ferromagnetic layer 200 corresponds to the x-y plane (e.g., the length (x) and width (y) of the ferromagnetic layer 200 while the thickness (z) of the ferromagnetic layer is orthogonal to the x-y plane). In some embodiments, the anisotropy of the ferromagnetic layers 200 is induced during manufacturing to permanently or semi-permanently set the hard and easy axes of magnetization. For example, the easy axis of magnetization 220 can be set by applying a bias magnetic field during or after deposition of each ferromagnetic layer 200 that is parallel to the desired easy axis of magnetization 220, and then annealing the respective ferromagnetic layer 200.

Each ferromagnetic layer 200 can include cobalt, iron, and/or nickel, or a compound or alloy comprising cobalt, iron, and/or nickel. In one example, the soft ferromagnetic layers 202 comprise or $Co_xZr_yTa_{1-x-y}$ (CZT) with x and y being approximately 0.915 and 0.04, respectively. In another example, the soft ferromagnetic layers 202 can comprise CoZrTa—B (or CoZrTaB), CoNiFe, NiFe, CoFe, and/or CoFeB, or alloys that include any of the foregoing compounds. The hard ferromagnetic bias layers 204 can comprise AlNiCo, NdFeB, SmCo, ferrite alloys of $Fe_xO_y$ that include one or more metals such as Co, Sr, and/or Ba, or alloys that include any of the foregoing compounds.

The insulator layer 210 can comprise (a) aluminum, cobalt, chromium, silicon, tantalum, titanium, and/or zirconium, or (b) a compound of (1) aluminum, cobalt, chromium, silicon, tantalum, titanium, and/or zirconium and (2) oxygen and/or nitrogen. For example, the insulator layer 210 can comprise silicon dioxide ($SiO_2$), aluminum oxide ($Al_xO_y$), chromium oxide ($Cr_xO_y$), cobalt oxide ($Co_xO_y$), tantalum oxide ($Ta_xO_y$), titanium oxide ($Ti_xO_y$), silicon nitride ($Si_xN_y$), aluminum nitride ($Al_xN_y$), tantalum nitride ($Ta_xN_y$), or a combination of two or more of the foregoing. In some embodiments, the insulator layer 210 can function as a spacer layer between neighboring ferromagnetic layers 200. The thickness of each spacer layer is related to the energy state for forming a closed magnetic field loop in neighboring soft and hard ferromagnetic layers 202, 204. In some embodiments, the thickness of the spacer layers can be adjusted to promote closed magnetic field loops in pairs of soft and hard ferromagnetic layers 202, 204, for example as discussed below with respect to FIG. 4.

On the top of the core 20, the insulator layer 210 can function as a capping layer 212. On the bottom of the core 20, the insulator layer 210 can function as an adhesion layer 214. Of course, the magnetic core 20 can be turned or rotated such that the terms "top" and "bottom" do not apply, but the layers would maintain the same relative positions with respect to each other.

The hard ferromagnetic bias layers 204 are magnetized to produce a respective bias magnetic field. The in-plane bias magnetic field flux 230, from the bias magnetic field, through the hard ferromagnetic bias layers 204 is in a first direction (e.g., from right to left as indicated by the arrows in FIG. 2) parallel to the easy axis of magnetization 220. The bias magnetic flux 230 through each hard ferromagnetic bias layer 204 forms a closed bias magnetic field loop by passing through the neighboring soft ferromagnetic layer(s) 202, as indicated by the curved arrows 235. The bias magnetic flux 230 through each soft ferromagnetic layer 202 is in a second direction (e.g., from left to right) that is opposite (e.g., antiparallel) to the first direction. The second direction is parallel to the easy axis of magnetization 220.

It is lower energy for the bias magnetic flux 230 to form a closed loop by passing through the neighboring hard ferromagnetic bias layer(s) 204 (as indicated by the curved arrows 235) than to form a closed loop by passing back through the same soft ferromagnetic layer 202 (e.g., to form domain walls within the respective soft ferromagnetic layer 202). For example, the hard ferromagnetic layers 204 have a higher permeability than the soft ferromagnetic layers 202.

The bias magnetic flux 230 through the soft ferromagnetic layers 202 produces magnetic moments and an induced magnetic flux 240 through the soft ferromagnetic layers 202 in the second direction. As with the bias magnetic flux 230, it is lower energy for the induced magnetic flux 240 to form a closed loop by passing through the neighboring hard ferromagnetic bias layer(s) 204 (as indicated by the curved arrows 235) than to form a closed loop by passing back through the same soft ferromagnetic layer 202 (e.g., to form domain walls within the respective soft ferromagnetic layer 202).

Domain wall reduction in the soft ferromagnetic layers 202 can improve the efficiency of the core 20 (e.g., by lowering the coercivity of the stacked core 20 compared to when the core 20 does not include hard ferromagnetic bias layers 204), such as when the core 20 is integrated into an inductor that operates at a high frequency (e.g., at least 1 MHz). For example, the core 20 can have lower hysteresis and eddy current power losses compared to when the core 20 does not include hard ferromagnetic bias layers 204.

Each hard ferromagnetic bias layer 204 can have a coercivity greater than 50 Oe, such as a range of about 50 Oe to about 1,000 Oe, including about 250 Oe, about 500 Oe, about 750 Oe, and any range or value between any two of the foregoing coercivities. Each soft ferromagnetic layer 204 can have a coercivity less than 1 Oe, such as a range of about 0.01 Oe to 1 Oe, including about 0.1 Oe, about 0.25 Oe, about 0.5 Oe, about 0.75 Oe, and any range or value between any two of the foregoing coercivities.

The thickness of each ferromagnetic layer 200 can be about 10 nm to about 1,000 nm. The thickness of each insulating layer 210 can be about 1 nm to about 50 nm. The total thickness of the core 20 can be less than or equal to about 100,000 nm (i.e., 100 microns). The thickness of the ferromagnetic layers 200, insulating layers 210, and core 20 is measured with respect to the "z" axis which is orthogonal to the principal plane of the core 20.

When core 20 is integrated into a multilevel wiring structure to form an inductor, the inductor coil is preferably configured and oriented so that the inductor coil magnetic flux passes through the ferromagnetic layers 200 in a direction parallel to the hard axis of magnetization 222.

Figure 3:
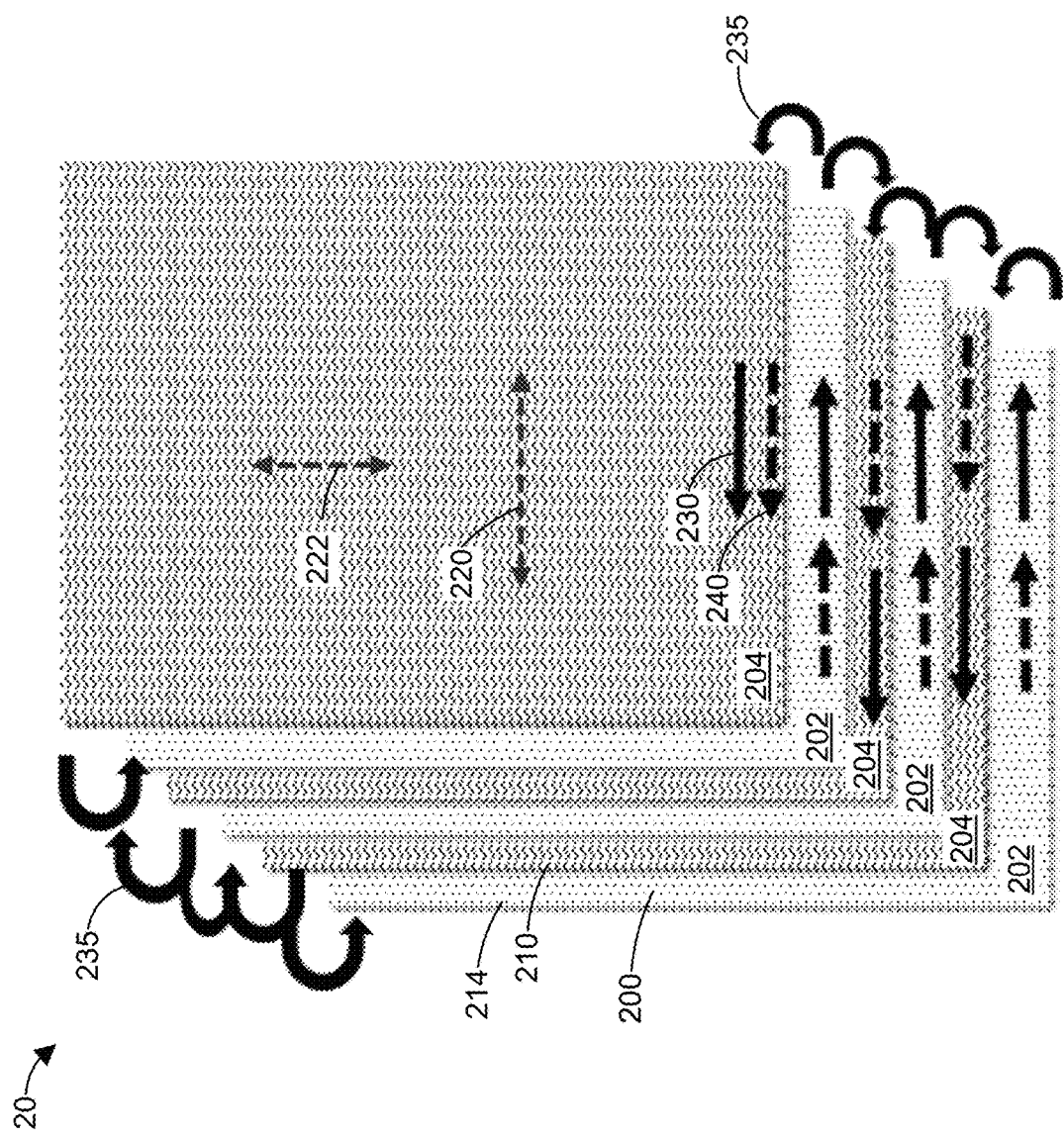
FIG. 3 is an exploded perspective view of the planar magnetic core illustrated in FIG. 2.

FIG. 3 is an exploded perspective view of the planar magnetic core 20 illustrated in FIG. 2. The capping layer 212 is not illustrated in FIG. 3 for clarity. FIG. 3 further illustrates the magnetic flux lines 230, 240 as they pass in a first direction (i.e., from in FIG. 3) through the hard ferromagnetic bias layers 204, in a second direction (i.e., from left-to-right right-to-left in FIG. 3) through the soft ferromagnetic layers 202, and as they extend between the soft and hard ferromagnetic layers 202, 204. Accordingly, the magnetic flux has a closed path through the soft and hard ferromagnetic layers 202, 204. The magnetic flux lines 230, 240 through the soft and hard ferromagnetic layers 202, 204 are parallel or substantially parallel to (e.g., within 10 degrees of) the easy axis of magnetization 220. In addition, the magnetic flux lines 230, 240 through the soft and hard ferromagnetic layers 202, 204 are orthogonal to or substantially orthogonal to (i.e., within 10 degrees of) the hard axis of magnetization 222 within the respective major planes of the soft and hard ferromagnetic layers 202, 204.

Figure 4:
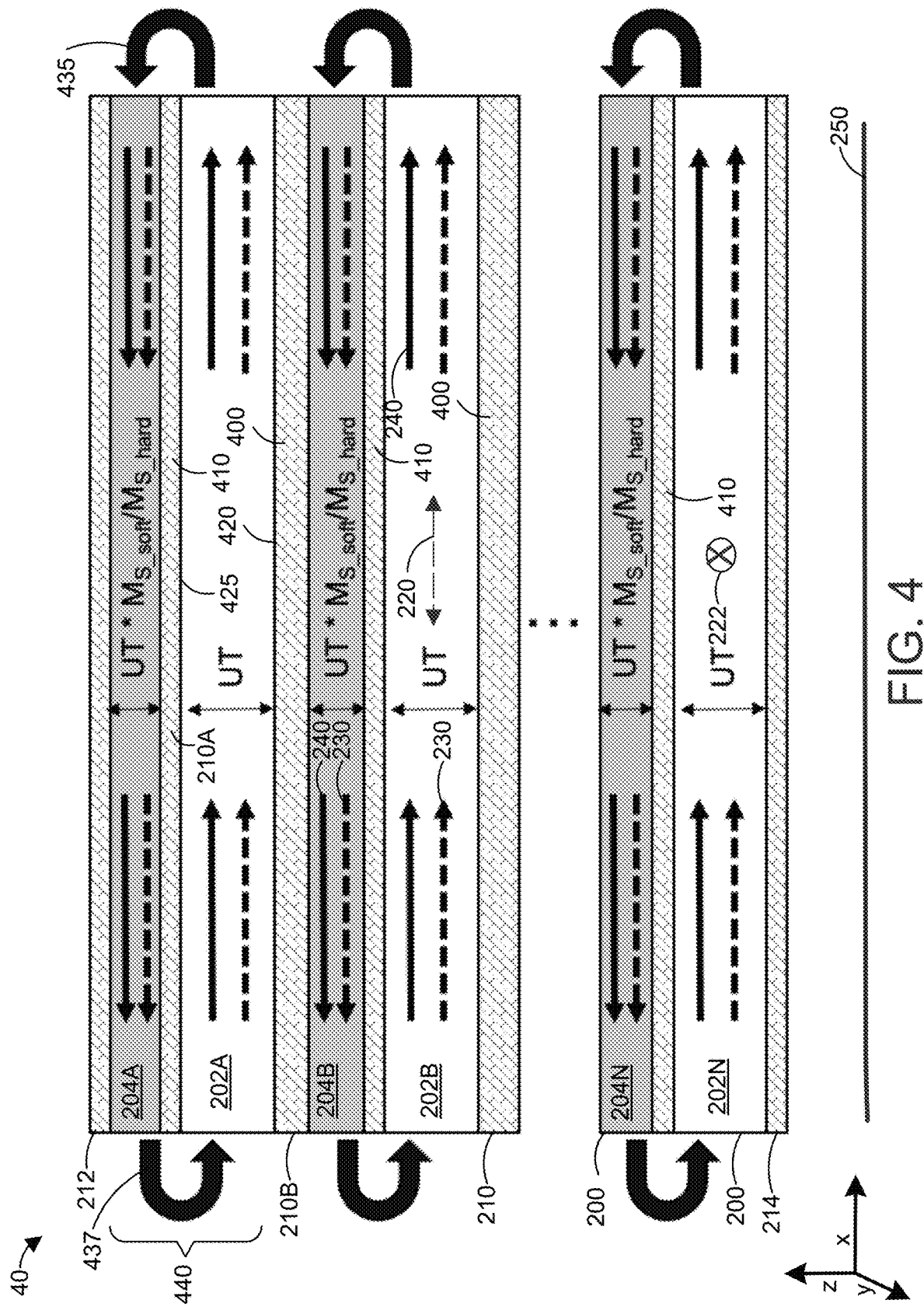
FIG. 4 is a cross-sectional view of a planar magnetic core according to another embodiment.

FIG. 4 is a cross-sectional view of a planar magnetic core 40 according to another embodiment. Core 40 is the same as core 20 except as described below. In FIG. 4, the soft and hard ferromagnetic layers 202, 204 are labeled as 202A, 202B, ... 202N and as 204A, 204B, ... 204N, respectively, for discussion purposes. The thicknesses of the soft and hard ferromagnetic layers 202, 204 in core 40 are related (e.g., co-optimized) such that the magnetic flux through a pair of neighboring soft and hard ferromagnetic layers 202, 204 is equal. In other words, $$\phi_{HL} = \phi_{SL} \quad (1)$$

where $\phi_{HL}$ is the magnetic flux through the hard ferromagnetic bias layer 204 and $\phi_{SL}$ is the magnetic flux through the soft ferromagnetic layer 202. Equation (1) can be rewritten as:

$$\mu_0 M_{S\_soft} \tau_{soft} = \mu_0 M_{S\_hard} \tau_{hard} \quad (2)$$

where $\mu_0$ is the permeability of free space, $M_{S\_soft}$ is the saturation magnetization of the soft ferromagnetic layer 202, $M_{S\_hard}$ is the saturation magnetization of the hard ferromagnetic bias layer 204, $\tau_{soft}$ is the thickness of the soft ferromagnetic layer 202, and $\tau_{hard}$ is the thickness of the hard ferromagnetic bias layer 204.

In order for the magnetic flux through a pair of neighboring soft and hard ferromagnetic layers 202, 204 to be equal, according to equations (1) and (2), the ratio of the thickness of the hard ferromagnetic bias layer 204 to the thickness of the soft ferromagnetic layer 202 is $$\frac{M_{S\_soft}}{M_{S\_hard}} : 1,$$

which co-optimizes the soft and hard ferromagnetic layer thicknesses for layer-to-layer magnetic flux closure. In FIG. 4, this thickness ratio is illustrated with each soft ferromagnetic layer 202 having a unit thickness (UT) and each hard ferromagnetic bias layer 204 having a thickness of $$UT \times \frac{M_{S\_soft}}{M_{S\_hard}}.$$

The thickness of the insulator layers 210 can be adjusted to promote closed magnetic field loops in pairs of soft and hard ferromagnetic layers 202, 204. In general, the core 40 has N soft-hard ferromagnetic pairs 440, with each soft-hard ferromagnetic pair 440 comprising one soft ferromagnetic layer 202 and one hard ferromagnetic bias layer 204. The N soft-hard ferromagnetic pairs 440 are repeating units in the core 40 where the relative positions of the soft and hard ferromagnetic layers 202, 204 are the same across each soft-hard ferromagnetic pair 440. For example, if the soft ferromagnetic layer 202 is disposed above the hard ferromagnetic bias layer 204 in a soft-hard ferromagnetic pair 440, the soft ferromagnetic layer 202 is disposed above the hard ferromagnetic bias layer 204 in all N soft-hard ferromagnetic pairs 440. Likewise, if the soft ferromagnetic layer 202 is disposed below the hard ferromagnetic bias layer 204 in a soft-hard ferromagnetic pair 440, the soft ferromagnetic layer 202 is disposed below the hard ferromagnetic bias layer 204 in all N soft-hard ferromagnetic pairs 440.

When a soft ferromagnetic layer 202 has two neighboring hard ferromagnetic bias layers 204, the thickness of a first insulator 210 that is disposed between the soft ferromagnetic layer 202 and a first neighboring hard ferromagnetic bias layer 204 (e.g., a hard ferromagnetic bias layer 204 in a neighboring soft-hard ferromagnetic pair 440) can be greater than the thickness of a second insulator 210 that is disposed between the soft ferromagnetic layer 202 and a second neighboring hard ferromagnetic bias layer 204 (e.g., a hard ferromagnetic bias layer 204 in the soft-hard ferromagnetic pair 440 as the soft ferromagnetic layer 202). Using soft ferromagnetic layer 202A as an example, the thickness of insulator layer 210B is greater than the thickness of insulator layer 210A. The thicker insulator layer (e.g., insulator layer 210B) can be referred to as an inter-pair spacer layer 400. The thinner insulator layer (e.g., insulator layer 210A) can be referred to as an intra-pair spacer layer 410.

The inter-pair spacer layer 400 can be about 2 to about 10 times the thickness of the intra-pair spacer layer 410. The thickness of the intra-pair spacer layer 410 can be about 1 nm to about 50 nm, including about 10 nm, about 20 nm, about 30 nm, about 40 nm, and any value or range between any two of the foregoing thicknesses. Thus, the thickness of the inter-pair spacer layer 400 is greater than the thickness of the intra-pair spacer layer 410. The thickness of each layer (e.g., ferromagnetic layers 200 and insulator layers 210) is measured with respect to the "z" axis which is orthogonal to the top and bottom planar surfaces of substrate 250 and to the major plane of core 40.

As a result of this difference in insulator layer thickness, it is lower energy for the bias and induced magnetic flux 230, 240 through soft ferromagnetic layer 202A to form a return path through hard ferromagnetic bias layer 204A than to form a return path through hard ferromagnetic bias layer 204B. Therefore, all or substantially all of the magnetic flux (e.g., bias and induced magnetic flux 230, 240) through soft ferromagnetic layer 202A forms a closed loop through hard ferromagnetic bias layer 204A, as indicated by curved arrows 435. In addition, all or substantially all of the magnetic flux (e.g., bias and induced magnetic flux 230, 240) through hard ferromagnetic bias layer 204A forms a closed loop through soft ferromagnetic layer 202A, as indicated by curved arrows 437.

In general, for each soft ferromagnetic layer 202 that has two neighboring hard ferromagnetic bias layers 204, an inter-pair spacer layer 400 is disposed on (e.g., in direct physical contact with) a first side 420 of each soft ferromagnetic layer 202 and an intra-pair spacer layer 410 is disposed on (e.g., in direct physical contact with) a second side 425 of the respective soft ferromagnetic layer 202. The first and second sides 420, 425 are on opposing sides of the soft ferromagnetic layer 202. In FIG. 4, the first side 420 is on the bottom of each soft ferromagnetic layer 202, where the bottom is closer to the substrate 250 than the top. Soft ferromagnetic layer 202N, located on the bottom of core 40, only has one neighboring hard ferromagnetic bias layer, 204N, and thus does not need a thicker inter-pair spacer layer 400 below the bottom surface of soft ferromagnetic layer 202N to set the magnetization. Instead, a thinner adhesion layer 214 is formed below soft ferromagnetic layer 202N. The thickness of the adhesion layer 214 and capping layer 212 can be the same as the thickness of the intra-pair spacer layer 410.

In an alternative embodiment, for each soft ferromagnetic layer 202 that has two neighboring hard ferromagnetic bias layers 204, the inter-pair spacer layer 400 is disposed above (e.g., in direct physical contact with) the second side 425 of each soft ferromagnetic layer 202 and the intra-pair spacer layer 410 is disposed below (e.g., in direct physical contact with) the first side 425 of the respective soft ferromagnetic layer 202 the top surface of each soft ferromagnetic layer 202. This would be the equivalent to rotating FIG. 4 by 180 degrees, such that hard ferromagnetic bias layer 204A is now on the "bottom" of core 40.

An advantage to pairing the soft and hard ferromagnetic layers 202, 204 is to direct all or substantially all of the bias magnetic flux 230 through one hard ferromagnetic bias layer 204 to pass through a corresponding soft ferromagnetic layer 202 in a soft-hard ferromagnetic pair 440, which maximizes the reduction in domain wall formation in each soft ferromagnetic layer 202.

It is noted that even when layer-to-layer flux closure occurs, it is still common to have some magnetic domain walls present within the soft ferromagnetic layers 202. However, the number of domain walls is reduced relative to the case where magnetic flux is primarily closed within an individual magnetic layer, such as when the hard ferromagnetic bias layers 204 are removed from core 40. This is advantageous because (1) domain walls can move when the core is exposed to an alternating magnetic field which causes power loss and (2) domain patterns that form when magnetic flux is closed within individual magnetic layers can reduce the total volume of magnetic material that respond to alternating magnetic fields, consequently reducing the maximum achievable inductance.

When core 40 is integrated into a multilevel wiring structure to form an inductor, the inductor coil is preferably configured and oriented so that the inductor coil magnetic flux passes through the soft and hard ferromagnetic layers 202, 204 in a direction parallel to the hard axis of magnetization 222.

Figure 5:
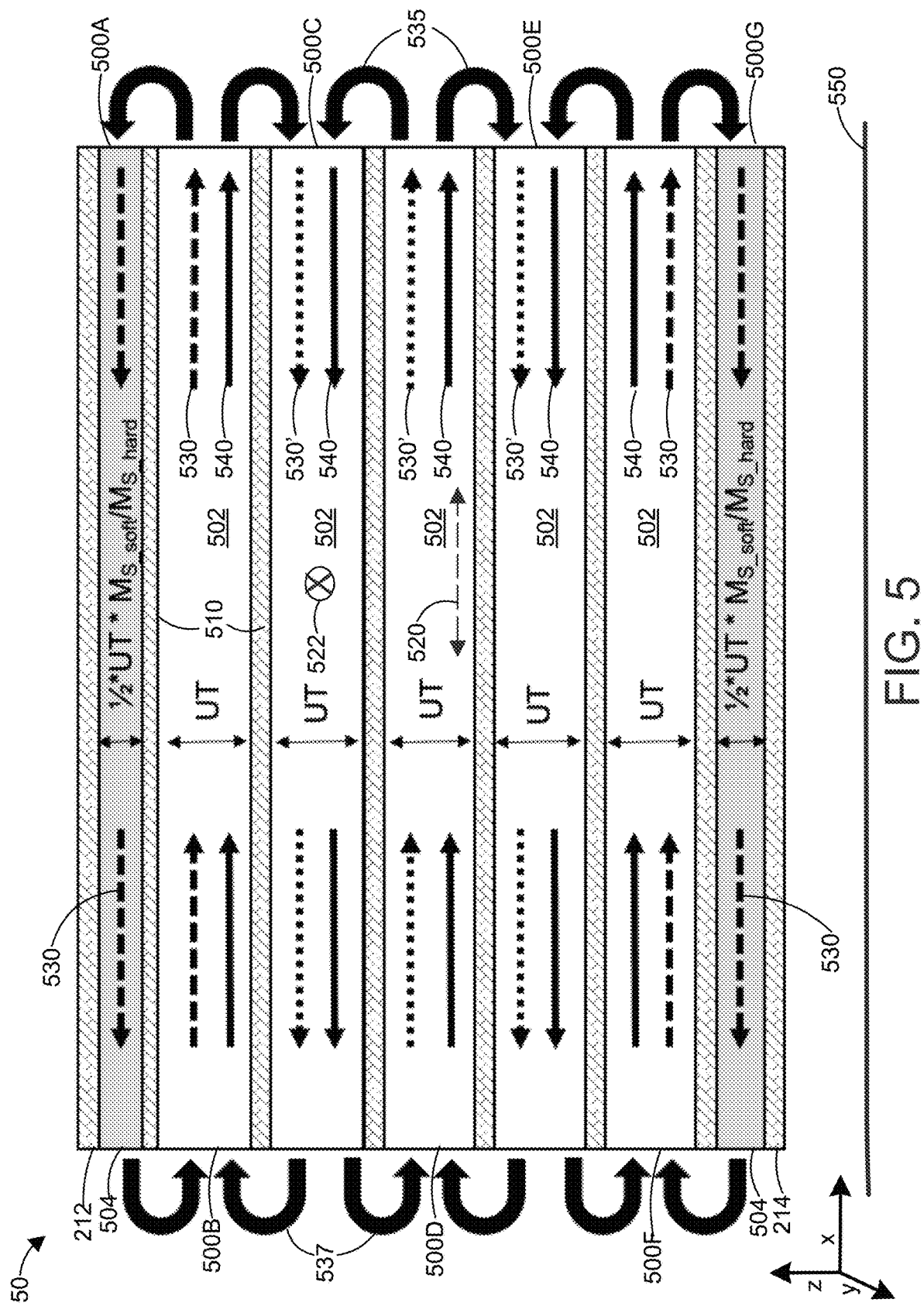
FIG. 5 is a cross-sectional view of a planar magnetic core according to another embodiment.

FIG. 5 is a cross-sectional view of a planar magnetic core 50 according to another embodiment. The planar magnetic core 50 can be fabricated on a substrate 550 and/or integrated into a multilevel wiring structure on substrate 550 to form an inductor.

The core 50 includes a plurality of ferromagnetic layers 500A-G (in general, ferromagnetic layers 500) and insulator layers 510. The core 50 also includes a capping layer 212 and an adhesion layer 214. Each ferromagnetic layer 500 is either a soft ferromagnetic layer 502 or a hard ferromagnetic bias layer 504. Each ferromagnetic layer 500 is anisotropic such that its easy axis of magnetization 520 is parallel to the "x" axis and its hard axis of magnetization 522 is parallel to the "y" axis. Thus, the hard axis of magnetization is orthogonal to the easy axis of magnetization 520 within the major plane of the ferromagnetic layer 500. The soft and hard ferromagnetic layers 502, 504 can be the same as the soft and hard ferromagnetic layers 202, 204, respectively. The insulator layers 510 can be the same as insulator layers 210 and/or intra-pair spacer layer 410.

The top and bottom (or first and last, respectively) ferromagnetic layers 500 (e.g., layers 500A, 500G) are hard ferromagnetic bias layers 504 (e.g., top and bottom hard ferromagnetic bias layers). The hard ferromagnetic bias layers 504 are configured to produce a bias magnetic field 540 in a first direction (e.g., from right to left) that is parallel to the easy axis of magnetization 520. All ferromagnetic layers 500 between the top and bottom hard ferromagnetic bias layers 504 are soft ferromagnetic layers 502. Core 50 is configured so that half of the magnetic flux through each soft ferromagnetic layer 502 forms a closed path through each neighboring ferromagnetic layer 500.

At the top of the core 50, the bias magnetic flux 530 passes through the hard ferromagnetic bias layer 500A in a first direction (e.g., from right to left) that is parallel to the easy axis of magnetization 520. The bias magnetic flux 530 has a return path through the soft ferromagnetic layer 500B, in a second direction (e.g., from left to right) that is parallel to the easy axis of magnetization 520, to form a closed loop. It is a lower energy state for the bias magnetic flux 530 through the soft ferromagnetic layer 500B to form a closed path through the hard ferromagnetic bias layer 500A than to form a closed loop by passing back through the same soft ferromagnetic layer 500B (e.g., to form domain walls).

The bias magnetic flux 530 through the soft ferromagnetic layer 500B produces magnetic moments and an induced magnetic flux 540 through the soft ferromagnetic layer 500B in the second direction. The magnitude of the induced magnetic flux 540 is equal to or approximately equal to the magnitude of the bias magnetic flux 530. The induced magnetic flux 540 through the soft ferromagnetic layer 500B (e.g., in the second direction) forms a closed loop through the soft ferromagnetic layer 500C (e.g., in the first direction) where the induced magnetic flux 540 functions as a bias magnetic flux 530'. It is a lower energy state for the induced magnetic flux 540 through soft ferromagnetic layer 500B to form a closed loop through soft ferromagnetic layer 500C (e.g., as bias magnetic flux 530') than to form a closed loop by passing back through soft ferromagnetic layer 500B (e.g., to form domain walls). Thus, half of the magnetic flux (e.g., the bias magnetic flux 530) through the soft ferromagnetic layer 500B forms a closed loop through the hard ferromagnetic bias layer 500A and the other half of the magnetic flux (e.g., the induced magnetic flux 540) through the soft ferromagnetic layer 500B forms a closed loop through the soft ferromagnetic layer 500C (e.g., as bias magnetic flux 530').

This repeats for all soft ferromagnetic layers 502 (e.g., soft ferromagnetic layers 500C-F). For example, the bias magnetic flux 530' through the soft ferromagnetic layer 500C produces additional magnetic moments and induced magnetic flux 540 through the soft ferromagnetic layer 500C. The magnitude of the induced magnetic flux 540 is approximately equal to the magnitude of the bias magnetic flux 530'. The induced magnetic flux 540 through the soft ferromagnetic layer 500C (e.g., in the first direction) forms a closed loop through the soft ferromagnetic layer 500D (e.g., in the second direction) where the induced magnetic flux 540 functions as a bias magnetic flux 530'. It is a lower energy state for the induced magnetic flux 540 through soft ferromagnetic layer 500C to form a closed loop through soft ferromagnetic layer 500D (e.g., as bias magnetic flux 530') than to form a closed loop by passing back through soft ferromagnetic layer 500C (e.g., to form domain walls). Thus, half of the magnetic flux (e.g., the bias magnetic flux 530') through the soft ferromagnetic layer 500C forms a closed loop through the soft ferromagnetic layer 500B (e.g., as induced magnetic flux 540) and the other half of the magnetic flux (e.g., the induced magnetic flux 540) through the soft ferromagnetic layer 500C forms a closed loop through the soft ferromagnetic layer 500D (e.g., as bias magnetic flux 530').

At the bottom of the core 50, the bias magnetic flux 530 passes through the hard ferromagnetic bias layer 500G in a first direction (e.g., from right to left) that is parallel to the easy axis of magnetization 520. The bias magnetic flux 530 has a return path through the soft ferromagnetic layer 500F, in a second direction (e.g., from left to right) that is parallel to the easy axis of magnetization 520, to form a closed loop. It is a lower energy state for the induced magnetic flux 540 through the soft ferromagnetic layer 500F to form a closed path through the hard ferromagnetic bias layer 500G than to form a closed loop by passing back through the same soft ferromagnetic layer 500F (e.g., to form domain walls).

The bias magnetic flux 530 through the soft ferromagnetic layer 500F produces magnetic moments and an induced magnetic flux 540 through the soft ferromagnetic layer 500F in the second direction. The magnitude of the induced magnetic flux 540 through soft ferromagnetic layer 500F is equal to or approximately equal to the magnitude of the bias magnetic flux 530 through soft ferromagnetic layer 500F.

The induced magnetic flux 540 through the soft ferromagnetic layer 500F (e.g., in the second direction) forms a closed loop through the soft ferromagnetic layer 500E (e.g., in the first direction) where the induced magnetic flux 540 functions as a bias magnetic flux 530'. It is a lower energy state for the induced magnetic flux 540 through soft ferromagnetic layer 500F to form a closed loop through soft ferromagnetic layer 500E (e.g., as bias magnetic flux 530') than to form a closed loop by passing back through soft ferromagnetic layer 500F (e.g., to form domain walls). Thus, half of the magnetic flux (e.g., the bias magnetic flux 530) through the soft ferromagnetic layer 500F forms a closed loop through the hard ferromagnetic bias layer 500G and the other half of the magnetic flux (e.g., the induced magnetic flux 540) through the soft ferromagnetic layer 500F forms a closed loop through the soft ferromagnetic layer 500E (e.g., as bias magnetic flux 530').

The thicknesses of the soft and hard ferromagnetic layers 502, 504 are co-optimized for layer-to-layer magnetic flux closure. As can be seen, the magnitude of the magnetic flux through the hard ferromagnetic bias layers 504 is equal to or approximately equal to half of the magnitude of the magnetic flux through the soft ferromagnetic layers 502. Therefore, the flux balancing equation (1) can be rewritten as:

$$\tfrac{1}{2}\mu_0 M_{S\_soft}\tau_{soft} = \mu_0 M_{S\_hard}\tau_{hard} \quad (3)$$

In order for the magnetic flux through neighboring soft and hard ferromagnetic layers 502, 504 to be equal, the ratio of the thickness of the hard ferromagnetic bias layer 504 to the thickness of the soft ferromagnetic layer 502 is $$\tfrac{1}{2}\frac{M_{S\_soft}}{M_{S\_hard}} : 1,$$

which co-optimizes the soft and hard ferromagnetic layer thicknesses for layer-to-layer magnetic flux closure. In FIG. 5, this thickness ratio is illustrated with each soft ferromagnetic layer 502 having a unit thickness (UT) and each hard ferromagnetic bias layer 504 having a thickness of $$\tfrac{1}{2} UT \times \frac{M_{S\_soft}}{M_{S\_hard}}.$$

The thickness of each layer (e.g., ferromagnetic layers 500 and insulator layers 510) is measured with respect to the "z" axis which is orthogonal to the top and bottom planar surfaces of substrate 550 and to the major plane of core 50. It is noted that the "demagnetizing" field is very strong in whatever the shortest direction of the structure is. In this case, the thickness ("z" dimension) is typically >100× smaller than the "y" and "x" dimensions of the ferromagnetic layers 500 so this field is very strong and prevents the "z" axis from being set as the easy axis in most cases.

When core 50 is integrated into a multilevel wiring structure to form an inductor, the inductor coil is preferably configured and oriented so that the inductor coil magnetic flux passes through the ferromagnetic layers 500 in a direction parallel to the hard axis of magnetization 522.

In general, the core 50 includes N ferromagnetic layers 500 where N is an odd integer that is greater than or equal to 3. In other words, the core 50 includes top and bottom hard ferromagnetic bias layers 504 and an odd integer of soft ferromagnetic layers 502 between the top and bottom hard ferromagnetic bias layers 504. An odd integer of soft ferromagnetic layers 502 prevents accumulation of induced magnetic flux 540 in the core 50.

Figure 6:
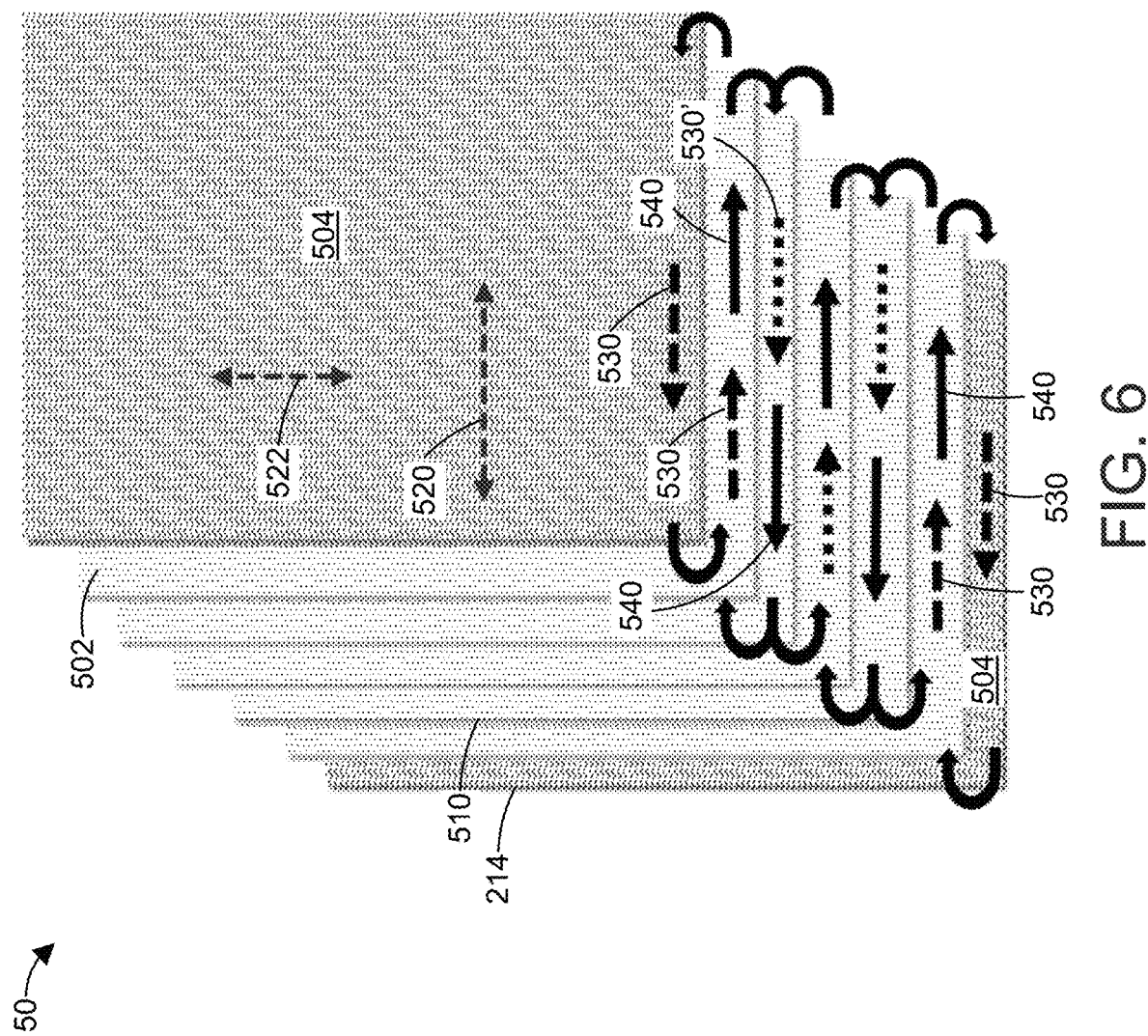
FIG. 6 is an exploded perspective view of the planar magnetic core illustrated in FIG. 5.

FIG. 6 is an exploded perspective view of the planar magnetic core 50 illustrated in FIG. 5. The capping layer 212 is not illustrated in FIG. 6 for clarity. FIG. 6 further illustrates the magnetic flux lines 530, 530', 540 in the ferromagnetic layers 500. The magnetic flux lines 530, 530', 540 through the soft and hard ferromagnetic layers 502, 504 are parallel or substantially parallel to (i.e., within 10 degrees of) the easy axis of magnetization 520. In addition, the magnetic flux lines 530 and/or 540 through the soft and hard ferromagnetic layers 502, 504 are orthogonal to or substantially orthogonal to (i.e., within 10 degrees of) the hard axis of magnetization 522.

Figure 7:
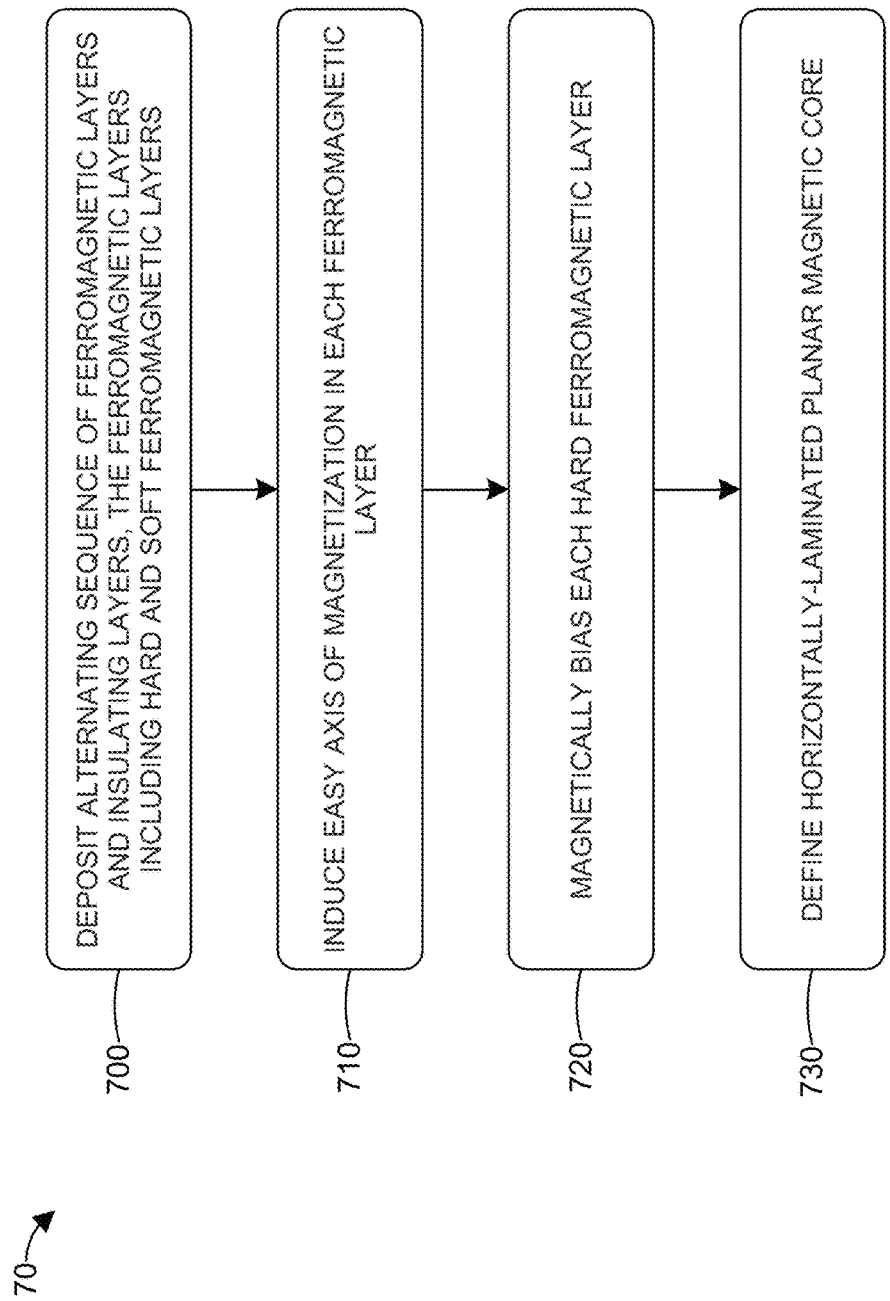
FIG. 7 is a flow chart of a method of manufacturing a semiconductor device according to an embodiment.

FIG. 7 is a flow chart 70 of a method of manufacturing a semiconductor device according to an embodiment. In step 700, an alternating sequence of ferromagnetic layers and insulating layers is deposited. The ferromagnetic layers include a plurality of hard ferromagnetic layers and a plurality of soft ferromagnetic layers, and each ferromagnetic layer comprises a soft ferromagnetic layer or a hard ferromagnetic layer. In addition, each hard ferromagnetic layer is a neighboring ferromagnetic layer of at least one (i.e., 1 or 2) neighboring soft ferromagnetic layers. For example, each hard ferromagnetic layer can be the top or bottom ferromagnetic layer in horizontally-laminated magnetic core. In this case, each hard ferromagnetic layer is a neighboring ferromagnetic layer of only one soft ferromagnetic layer (e.g., the hard ferromagnetic layer on top of the core has a neighboring soft ferromagnetic layer below the top hard ferromagnetic layer, and the hard ferromagnetic layer on the bottom of the core has a neighboring soft ferromagnetic layer above the bottom hard ferromagnetic bias layer). In another example, the hard ferromagnetic layer is disposed between the top and bottom ferromagnetic layers, in which case the hard ferromagnetic layer has two neighboring soft ferromagnetic layers (one above and one below the hard ferromagnetic bias layer). In some embodiments, the ferromagnetic layers can be deposited in soft-hard ferromagnetic layer pairs.

In step 710, an easy axis of magnetization is induced in each ferromagnetic layer. The easy axis of magnetization is parallel to a top planar surface of the semiconductor substrate over or on which the semiconductor device is formed and is within the major plane of the respective ferromagnetic layer. The easy axis is also within the major plane of the respective ferromagnetic layer. The easy axis of magnetization can be induced during or after ferromagnetic layer deposition (step 700). For example, during ferromagnetic layer deposition (e.g., electrodeposition and/or sputter deposition) a bias magnetic field can be applied. The bias magnetic field is configured to pass through the ferromagnetic layer, as it is deposited, in a direction parallel to the top planar surface of the semiconductor substrate to form the easy axis of magnetization. Additionally or alternatively, the bias magnetic field can be applied during a post-deposition anneal.

Inducing an easy axis of magnetization in each ferromagnetic layer induces a hard axis of magnetization in the respective ferromagnetic layer. The hard axis of magnetization is orthogonal to the easy axis of magnetization within the major plane of the respective ferromagnetic layer. For example, the easy axis of magnetization can be parallel to the "x" axis, the hard axis of magnetization can be parallel to the "y" axis, and the ferromagnetic layers can be deposited along the "z" axis.

In step 720, each hard ferromagnetic layer is magnetized to form a respective hard ferromagnetic bias layer. Each hard ferromagnetic bias layer creates an in-plane bias magnetic flux through the respective hard ferromagnetic bias layer in a first direction that is parallel to the easy axis of magnetization (e.g., induced in step 710) in each ferromagnetic layer. The bias magnetic flux has a magnetization state oriented in a first direction. The bias magnetic flux forms a closed path by passing through the neighboring soft ferromagnetic layer in a second direction that is opposite to the first direction. Each hard ferromagnetic layer can be magnetized during deposition of the hard ferromagnetic layer, during a post-deposition anneal (e.g., in the presence of an in-plane magnetic field of sufficient strength), and/or during the inducement of the easy axis of magnetization in the hard ferromagnetic layer (e.g., in step 710). In some embodiments, steps 710 and 720 occur simultaneously.

In step 730, a horizontally-laminated planar magnetic core that includes the ferromagnetic layers and the insulating layers is defined, such as through photolithography and etching.

In some embodiments, the method can include forming a conductive winding around the horizontally-laminated planar magnetic core, such as to form an inductor. The conductive winding can be configured to form an inductor coil magnetic field that passes through the at least one neighboring soft ferromagnetic layer in a direction parallel to the hard axis of magnetization of the at least one neighboring soft ferromagnetic layer, for example to avoid domain wall motion and associated energy losses.

In one embodiment, the top ferromagnetic layer in the plurality of ferromagnetic layers is a hard ferromagnetic bias layer (e.g., a top hard ferromagnetic bias layer). Additionally or alternatively, the bottom ferromagnetic layer in the plurality of ferromagnetic layers is a hard ferromagnetic bias layer (e.g., a bottom hard ferromagnetic bias layer). When the top and bottom ferromagnetic layers are hard ferromagnetic bias layers, respectively, the other ferromagnetic layers can be only soft ferromagnetic layers (e.g., an odd integer of soft ferromagnetic layers). In this embodiment, the ratio of the hard ferromagnetic thickness of each hard ferromagnetic bias layer to the soft ferromagnetic thickness of each soft ferromagnetic layer can be $$\frac{1}{2} \times \frac{M_{S\_soft}}{M_{S\_hard}} : 1$$

where $M_{S\_soft}$ is the saturation magnetization of each soft ferromagnetic layer and $M_{S\_hard}$ is the saturation magnetization of each hard ferromagnetic bias layer, as discussed above.

In another embodiment, the ferromagnetic layers are deposited as soft-hard ferromagnetic layer pairs where each soft-hard ferromagnetic layer pair includes one soft ferromagnetic layer and one hard ferromagnetic bias layer. An intra-pair spacer layer is deposited between the soft ferromagnetic layer and the hard ferromagnetic bias layer in each soft-hard ferromagnetic layer pair, and an inter-pair spacer layer is deposited between neighboring soft-hard ferromagnetic layer pairs. The inter-layer spacers and the intra-layer spacers are insulating layers, where the inter-pair spacer layer thickness of each inter-pair spacer layer is greater than the intra-layer spacer thickness of each intra-layer spacer. In this embodiment, a ratio of a hard ferromagnetic thickness of each hard ferromagnetic bias layer to a soft ferromagnetic thickness of each soft ferromagnetic layer is $$\frac{1}{2} \times \frac{M_{S\_soft}}{M_{S\_hard}} : 1$$

where $M_{S\_soft}$ is the saturation magnetization of each soft ferromagnetic layer and $M_{S\_hard}$ is the saturation magnetization of each hard ferromagnetic bias layer.

Figure 8:
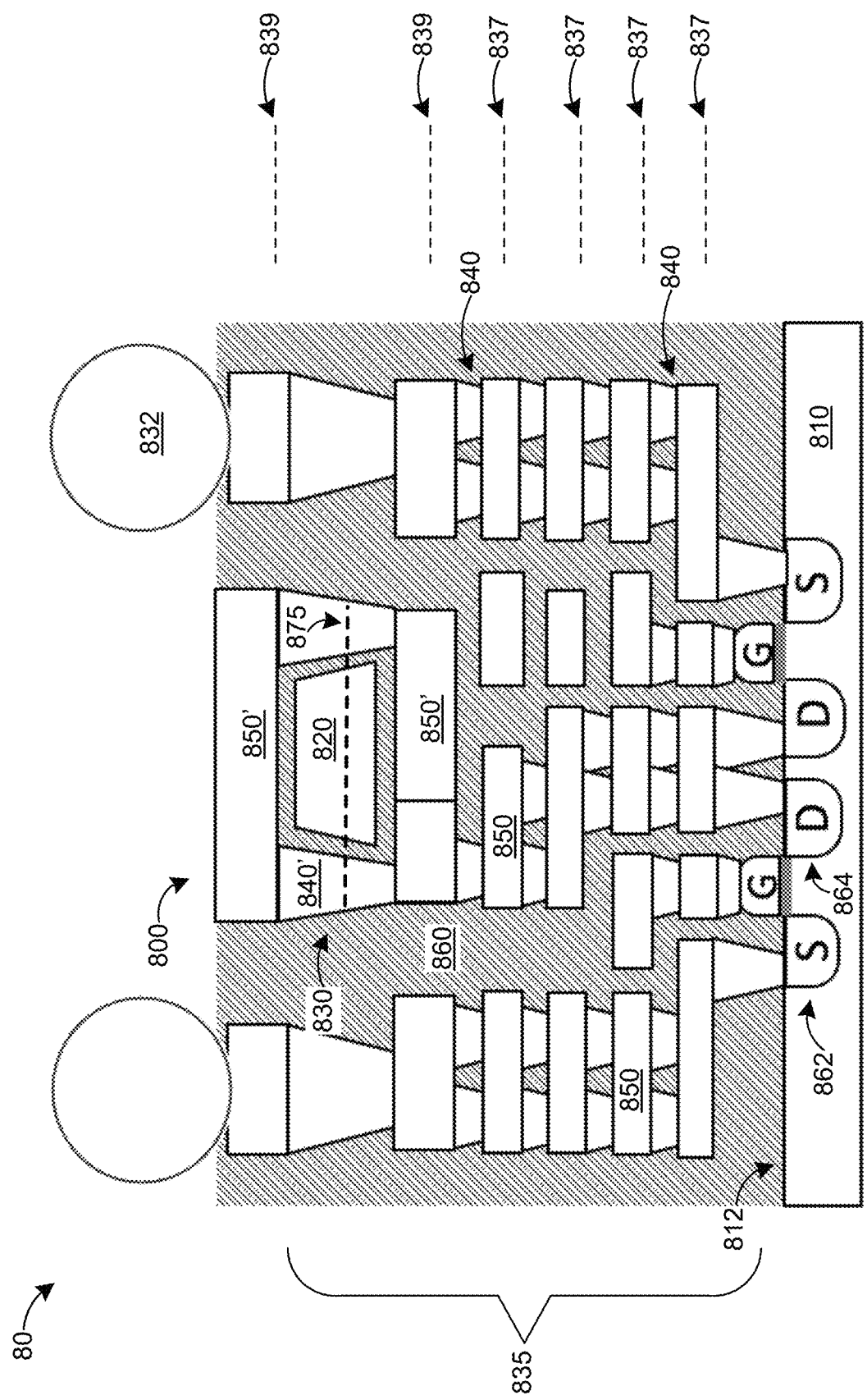
FIG. 8 is a representative cross section of a magnetic core inductor integrated into a semiconductor device on a substrate according to an embodiment.

FIG. 8 is a representative cross section 80 of a magnetic core inductor 800 integrated into a semiconductor device on a substrate 810 according to an embodiment. The inductor 800 includes a horizontally-laminated magnetic core 820 and a conductive winding 830.

The conductive winding 830 is integrated into a multi-level wiring network 835 that provides electrical connections between PMOS and NMOS transistor gates 862, 864, the inductor 800, and integrated circuit (IC) chip contact structures 832. The PMOS and NMOS transistor gates 862, 864 are fabricated on a semiconductor substrate 810 (e.g., silicon, silicon-on-insulator, or another semiconductor substrate). The IC chip contact structures 832 can comprise C4 contacts, solder bumps, or copper pillars, but any other contacts for the semiconductor device's external communication are acceptable without limitation.

The multilevel wiring network 835 is arranged into wiring planes 820. Each wiring plane 820 contains wire segments 850. Electrical connections between wiring segments 850 of differing wiring planes 837 are provided by conductive VIAs 840. The spaces in the multilevel wiring network 835 are filled with a dielectric insulating material 860 such as SiO$_2$.

The inductor 800 is integrated on top of the multilevel wiring network 835. The conductive winding 830 is piecewise constructed of wire segments 850' and of VIAs 840' that are disposed in at least two integration planes 839 on top of the multilevel wiring network 835. The VIAs 840' that form parts of the winding 830 are vertical or orthogonal to the principal plane 875 and electrically interconnect the wire segments 850' in the two integration planes 839. In other embodiments, the inductor 800 can be integrated into the multilevel wiring network 835 instead of in the integration planes 830 on top of the multilevel wiring network 835.

The magnetic core 820 can comprise any of the magnetic cores described herein. For example, magnetic core 820 can be the same as or can comprise core 20, core 40, or core 50. The conductive winding 830 is configured and/or arranged to generate an inductor coil magnetic field that produces an inductor coil magnetic flux through the soft ferromagnetic layers in the core 820. The inductor coil magnetic flux is parallel to the hard axis of magnetization in the respective soft ferromagnetic layer. The inductor coil magnetic flux through the soft ferromagnetic layers and the easy axis of magnetization in the soft ferromagnetic layers are parallel and/or substantially parallel to the principal plane 875 of the planar magnetic core 820, which is also parallel and/or substantially parallel to the wiring planes 837 and the top surface 812 of the semiconductor substrate 810.

The inductor 800 can be a component of a power converter, such as a switched inductor DC-DC power converter. In some embodiments, the power converter can include multiple inductors, with each inductor being the same as or similar to inductor 800. The inductors can be arranged in parallel electrically with one another, in series electrically with one another, or a combination thereof. The plurality of inductors can be integrated on the same integration or wiring planes or in different integration or wiring planes.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. A horizontally-laminated planar magnetic core comprising:
   a plurality of ferromagnetic layers that includes a plurality of hard ferromagnetic layers and a plurality of soft ferromagnetic layers, wherein:
      each ferromagnetic layer comprises one of the soft ferromagnetic layers or one of the hard ferromagnetic layers, and
      each hard ferromagnetic layer is a neighboring ferromagnetic layer of at least one soft ferromagnetic layer, and
   a plurality of insulating layers, each insulating layer disposed between adjacent ferromagnetic layers,
   wherein:
      each ferromagnetic layer has an easy axis of magnetization parallel to a principal plane of the planar magnetic core, and the easy axes of magnetization are aligned,
      the plurality of hard ferromagnetic layers includes a top hard ferromagnetic layer disposed as a top ferromagnetic layer,
      the plurality of hard ferromagnetic layers includes a bottom hard ferromagnetic layer disposed as a bottom ferromagnetic layer,
      the plurality of soft ferromagnetic layers are disposed between the top and bottom hard ferromagnetic layers,
      the top and bottom hard ferromagnetic layers are each magnetized to produce a respective bias magnetic flux through the top and bottom hard ferromagnetic layers, respectively, in a first direction that is parallel to the easy axes of magnetization in the top and bottom hard ferromagnetic layers,
      the respective bias magnetic flux through the top hard ferromagnetic layer forms a closed loop through a first neighboring soft ferromagnetic layer,
      the respective bias magnetic flux through the bottom hard ferromagnetic layer forms a closed loop through a second neighboring soft ferromagnetic layer, and
      the respective bias magnetic flux passes through the first and second neighboring soft ferromagnetic layers in a second direction that is opposite to the first direction.

2. The core of claim 1, wherein a thickness of each ferromagnetic layer is in a range of about 10 nm to about 1,000 nm, the thickness measured with respect to an axis that is orthogonal to the principal plane of the planar magnetic core.

3. The core of claim 2, wherein a thickness of each insulating layer is in a range of about 1 nm to about 50 nm, the thickness of each insulating layer measured with respect to the axis.

4. The core of claim 3, wherein a total thickness of the core is less than or equal to 100,000 nm, the total thickness measured with respect to the axis.

5. The core of claim 1, wherein:
a soft ferromagnetic thickness of each soft ferromagnetic layer is the same,
a hard ferromagnetic thickness of each hard ferromagnetic layer is the same, and
the hard ferromagnetic thickness is related to the soft ferromagnetic thickness.

6. The core of claim 5, wherein a ratio of the hard ferromagnetic thickness to the soft ferromagnetic thickness is $$\frac{1}{2} \times \frac{M_{S\_soft}}{M_{S\_hard}} : 1$$

where $M_{S\_soft}$ is the saturation magnetization of each soft ferromagnetic layer and $M_{S\_hard}$ is the saturation magnetization of each hard ferromagnetic layer.

7. The core of claim 1, wherein the ferromagnetic layers are stacked along a height of the planar magnetic core.

8. The core of claim 1, wherein the plurality of soft ferromagnetic layers comprises N soft ferromagnetic layers, where N is an odd integer greater than or equal to 3.

9. The core of claim 1, wherein:
the respective bias magnetic flux through the first and second neighboring soft ferromagnetic layers induces a magnetic flux through the first and second neighboring soft ferromagnetic layers in the second direction,
the induced magnetic flux through the first neighboring soft ferromagnetic layer forms a closed loop through a third neighboring soft ferromagnetic layer in the first direction,
the induced magnetic flux through the second neighboring soft ferromagnetic layer forms a closed loop through a fourth neighboring soft ferromagnetic layer in the first direction,
the top hard ferromagnetic layer and the third neighboring soft ferromagnetic layer are the neighboring ferromagnetic layers of the first neighboring soft ferromagnetic layer, and
the bottom hard ferromagnetic layer and the fourth neighboring soft ferromagnetic layer are the neighboring ferromagnetic layers of the second neighboring soft ferromagnetic layer.

10. The core of claim 1, wherein the hard and soft ferromagnetic layers comprise cobalt, iron, and/or nickel.

11. The core of claim 1, wherein the insulating layers comprise:
(a) aluminum, cobalt, chromium, silicon, tantalum, titanium, and/or zirconium, or
(b) a compound of (1) aluminum, cobalt, chromium, silicon, tantalum, titanium, and/or zirconium and (2) oxygen and/or nitrogen.

12. The core of claim 1, wherein:
each hard ferromagnetic layer has a coercivity above 50 Oe, and
each soft ferromagnetic layer has a coercivity below 1 Oe.

13. A horizontally-laminated planar magnetic core comprising:
a plurality of soft-hard ferromagnetic layer pairs, each soft-hard ferromagnetic layer pair including a soft ferromagnetic layer and a hard ferromagnetic layer;
an intra-pair spacer layer disposed between the soft ferromagnetic layer and the hard ferromagnetic layer in each soft-hard ferromagnetic layer pair;
an inter-pair spacer layer disposed between neighboring soft-hard ferromagnetic layer pairs,
wherein:
an inter-pair spacer thickness of each inter-pair spacer layer is greater than an intra-pair spacer thickness of each intra-pair spacer layer, and
the inter-pair spacer thickness and the intra-pair spacer thickness are measured with respect to an axis that is orthogonal to a major plane of the core.

14. The core of claim 13, wherein:
a soft ferromagnetic thickness of each soft ferromagnetic layer is the same,
a hard ferromagnetic thickness of each hard ferromagnetic layer is the same,
the soft and hard ferromagnetic thicknesses are measured with respect to the axis, and
the hard ferromagnetic thickness is related to the soft ferromagnetic thickness.

15. The core of claim 14, wherein in each soft-hard ferromagnetic layer pair:
the hard ferromagnetic layer is magnetized to produce a bias magnetic flux through the hard ferromagnetic layer in a first direction that is parallel to an easy axis of magnetization in the hard ferromagnetic layer, the easy axis of magnetization disposed within a major plane of the hard ferromagnetic layer, and
the bias magnetic flux forms a closed loop only through the soft ferromagnetic layer in a second direction that is parallel to an easy axis of magnetization in the soft ferromagnetic layer, the easy axis of magnetization disposed within a major plane of the soft ferromagnetic layer.

16. The core of claim 15, wherein in each soft-hard ferromagnetic layer pair:
the bias magnetic flux through the soft ferromagnetic layer induces a magnetic flux through the soft ferromagnetic layer in the second direction, and
the induced magnetic flux forms a closed loop only through the hard ferromagnetic layer in the first direction.

17. The core of claim 16, wherein a ratio of the hard ferromagnetic thickness to the soft ferromagnetic thickness is $$\frac{M_{S\_soft}}{M_{S\_hard}} : 1$$

where $M_{S\_soft}$ is the saturation magnetization of each soft ferromagnetic layer and $M_{S\_hard}$ is the saturation magnetization of each hard ferromagnetic layer.

18. The core of claim 17, wherein:
the inter-pair spacer thickness of the first and second inter-pair spacer layers is the same,
the intra-pair spacer thickness of each intra-pair spacer layer is the same, and
the inter-pair spacer thickness is in a range of 2 to 10 times the intra-layer spacer thickness.

19. The core of claim 13, wherein for each soft-hard ferromagnetic pair, a relative position of the soft ferromagnetic layer with respect to the hard ferromagnetic layer is the same.

20. The core of claim 19, wherein for each soft-hard ferromagnetic pair, the soft ferromagnetic layer is disposed below the hard ferromagnetic layer.

21. The core of claim 13, further comprising:
a first inter-pair spacer layer disposed between a first soft-hard ferromagnetic layer pair and a second soft-hard ferromagnetic layer pair; and
a second inter-pair spacer layer disposed between the second soft-hard ferromagnetic layer pair and a third soft-hard ferromagnetic layer pair, the second soft-hard ferromagnetic layer pair disposed between the first and third soft-hard ferromagnetic layer pairs.

22. The core of claim 13, wherein the intra-pair spacer layers and the inter-pair spacer layers comprise an insulator material.

23. An inductor comprising:
a horizontally-laminated planar magnetic core comprising:
a plurality of ferromagnetic layers that includes a plurality of hard ferromagnetic layers and a plurality of soft ferromagnetic layers, wherein:
each ferromagnetic layer comprises one of the soft ferromagnetic layers or one of the hard ferromagnetic layers, and
each hard ferromagnetic layer is a neighboring ferromagnetic layer of at least one neighboring soft ferromagnetic layer, and
a plurality of insulating layers, each insulating layer disposed between adjacent ferromagnetic layers,
wherein each ferromagnetic layer has an easy axis of magnetization parallel to a principal plane of the planar magnetic core, and the easy axes of magnetization are aligned, and
a conductive winding that turns around in a generally spiral manner on the outside of said planar laminated magnetic core.

24. The inductor of claim 23, wherein:
the plurality of hard ferromagnetic layers includes a top hard ferromagnetic layer disposed as a top ferromagnetic layer and a bottom hard ferromagnetic layer disposed as a bottom ferromagnetic layer,
the plurality of soft ferromagnetic layers are disposed between the top and bottom hard ferromagnetic layers,
each of the top and bottom hard ferromagnetic layers is magnetized to produce a respective bias magnetic flux through the top and bottom hard ferromagnetic layers, respectively, in a first direction that is parallel to the easy axes of magnetization in the top and bottom hard ferromagnetic layers,
the bias magnetic flux through the top hard ferromagnetic layer forms a closed loop through a first neighboring soft ferromagnetic layer,
the bias magnetic flux through the bottom hard ferromagnetic layer forms a closed loop through a second neighboring soft ferromagnetic layer, and
the bias magnetic flux passes through the first and second neighboring soft ferromagnetic layers in a second direction that is opposite to the first direction.

25. The inductor of claim 24, wherein:
the bias magnetic flux through the first and second neighboring soft ferromagnetic layers induces a magnetic flux through the first and second neighboring soft ferromagnetic layers in the second direction,
the induced magnetic flux through the first neighboring soft ferromagnetic layer forms a closed loop through a third neighboring soft ferromagnetic layer in the first direction,
the induced magnetic flux through the second neighboring soft ferromagnetic layer forms a closed loop through a fourth neighboring soft ferromagnetic layer in the first direction,
the top hard ferromagnetic layer and the third neighboring soft ferromagnetic layer are the neighboring ferromagnetic layers of the first neighboring soft ferromagnetic layer, and
the bottom hard ferromagnetic layer and the fourth neighboring soft ferromagnetic layer are the neighboring ferromagnetic layers of the second neighboring soft ferromagnetic layer.

26. The inductor of claim 23, wherein:
each ferromagnetic layer has a hard axis of magnetization that is orthogonal to the easy axis of magnetization within a major plane of the respective ferromagnetic layer, and the hard axes of magnetization are aligned, and
the conductive winding is configured to produce an inductor coil magnetic flux through the horizontally-laminated planar magnetic core in a direction parallel to the hard axis of magnetization in each ferromagnetic layer.

27. A structure comprising:
a semiconductor integrated circuit comprising a multi-level wiring network formed on a substrate,
wherein the inductor of claim 23 in integrated into the multilevel wiring network.

* * * * *